US006300797B1

(12) United States Patent
Koizumi

(10) Patent No.: US 6,300,797 B1
(45) Date of Patent: Oct. 9, 2001

(54) SEMICONDUCTOR DEVICE, AND LIQUID CRYSTAL DEVICE AND ELECTRONIC EQUIPMENT USING THE SAME

(75) Inventor: Norio Koizumi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/534,525

(22) Filed: Mar. 27, 2000

(30) Foreign Application Priority Data

Mar. 30, 1999 (JP) ..................................... 11-089667
Jan. 14, 2000 (JP) ..................................... 12-006416

(51) Int. Cl.[7] ..................................... H03K 19/0175
(52) U.S. Cl. ..................................... 326/82; 326/88; 326/92
(58) Field of Search ..................................... 326/82, 86, 88, 326/90, 92; 345/90, 92, 94, 95

(56) References Cited

U.S. PATENT DOCUMENTS 5,323,171 * 6/1994 Yokouchi et al. .................... 345/94
5,745,092 * 4/1998 Ito .................................... 345/95
5,818,258 * 10/1998 choi .................................. 326/83

FOREIGN PATENT DOCUMENTS 0 424 958 2/1991 (EP) .
0 479 304 8/1992 (EP) .
0 642 112 8/1995 (EP) .
0 721 137 10/1996 (EP) .
0 881 622 2/1998 (EP) .

* cited by examiner

*Primary Examiner*—Michael Tokar
*Assistant Examiner*—Anh Tran
(74) *Attorney, Agent, or Firm*—Oliff & Berridge, PLC

(57) ABSTRACT

A semiconductor device capable of preventing malfunctions of instantaneous lighting, and comprises a drive circuit, a drive control circuit, and a power supply circuit. The power supply circuit has a boosting circuit which is provided with a first power supply potential VDD being a ground potential from an external power supply and a second power supply potential VSS, being a potential other than the ground potential, and raises the absolute value of the second power supply potential VSS and charges to the capacitor; and a bias generating circuit generating a potential to be supplied to the drive circuit and drive control circuit based on the output potential of the boosting circuit. A first power supply potential VDD and the potential of the bias generating circuits are supplied to the drive circuit which outputs a potential selected from the potentials V0 to V5 supplied in accordance with the control of the drive control circuit during a normal power supply period, and, during a power supply emergency, in which the absolute value between the first and the second potentials VDD and VSS becomes lower than a prescribed vale, tuns on a P-type MOS transistor based on a LOW active signal from a buffer, whereby all potentials output from the drive circuit are forcibly set to the first power supply potential VDD.

15 Claims, 21 Drawing Sheets

SEMICONDUCTOR DEVICE, AND LIQUID CRYSTAL DEVICE AND ELECTRONIC EQUIPMENT USING THE SAME

BACKGROUND OF THE INVENTION

1. Field of the Invention

The present invention relates to a semiconductor device with a power supply circuit mounted thereon, and a liquid crystal device and electronic equipment using the semiconductor device. Particularly, the present invention relates to a technique for the prevention of malfunctions which may occur in the case of power supply emergencies, such as in the case where a battery is taken out.

2. Description of the Related Art

In a liquid crystal device such as a liquid crystal display, a display operation is implemented when a voltage is applied to liquid crystals which are sealed between substrates in which electrodes are formed. This type of liquid crystal display has been widely used in recent years in various electronic equipment such as personal computers, word processors, cellular phones, electronic pocketbooks, and the like.

Such electronic equipment using a liquid crystal display is designed so that the screen becomes blank instantaneously when the power source is cut off according to a prescribed sequence. The phenomenon of instantaneous lighting occurs when the display is turned off by a procedure other than the above-described sequence, such as the case in which the battery is abruptly drawn out during the display operation, or the electronic equipment is forcedly terninated. Specifically, in this phenomenon the screen image instantaneously disappears when the battery is drawn out during display, following which lighting images such as horizontal lines appear for a while.

The present inventors have conducted extensive studies concerning the instantaneous lighting phenomenon and have achieved the present invention.

SUMMARY OF THE INVENTION

Accordingly, an objective of the present invention is to provide a semiconductor device with a power supply circuit mounted thereon, which can prevent malfunctions such as instantaneous lighting which occurs at the time of power supply emergencies, and a liquid crystal device and electronic equipment using the semiconductor device.

In one aspect of the present invention, a semiconductor device including a drive circuit, a drive control circuit which controls the drive circuit, and a power supply circuit which supplies a potential to the drive circuit and drive control circuit, wherein the power supply circuit comprises:

a boosting circuit, to which a first power supply potential which is a ground potential from an external power supply and a second power supply potential which is a potential other than the ground potential are supplied, and raising the absolute value of the second power supply potential and charging the boosted potential to the capacitor; and a bias generating circuit generating a potential supplied to the drive circuit and the drive control circuit based on the output potential of the boosting circuit, and wherein the first power supply potential and a potential from the bias generating circuit are supplied to the drive circuit that outputs a potential selected from potentials supplied in accordance with a control of the drive control circuit during a normal power supply period, and, in the event of a power supply emergency in which an absolute value between the first and the second power supply potentials is lower than a given value, changes all potentials outputted from the drive circuit into the first power supply potential based on the signal activated in the event of the power supply emergency.

When a battery is drawn out and a power supply is forcibly cut off, for example, the first potential and the second potential which are supplied from external power supply sources become equal, e.g. the same potential as the ground potential, after a certain period of time.

Malfunctions such as instantaneous lighting occur because the time period required for the charge to be stored up to the capacitor of the boosting circuit after the forced cutoff of the power supply is longer than the period of time for the first and the second potentials to become equivalent.

In this instance, a potential equivalent to that discharged after cutoff of the power supply is supplied to the drive circuit and drive control circuit which receive a supply of potential from the power supply circuit including this boosting circuit. Malfunctions are caused by such a potential.

Therefore, in the event of a power supply emergency in which the absolute value between the first and the second power supply potentials is lower than a specified value, the drive circuit changes all potentials outputted from the drive circuit to a value equivalent to the first power supply potential (the ground potential) based on-the signals which becomes active when a power supply emergency occurs. This causes all devices which are operated by a potential supplied by the semiconductor device to be completely shutoff without malfunction.

In another aspect of the present invention, a semiconductor device including a drive circuit, a drive control circuit which controls the drive circuit, and a power supply circuit which supplies a potential to the drive circuit and drive control circuit, wherein the power supply circuit comprises:

a boosting circuit, to which a first power supply potential which is a ground potential from an external power supply and a second power supply potential which is a potential other than the ground potential are supplied, and raising the absolute value of the second power supply potential and charging the boosted potential to the capacitor; and a bias generating circuit generating a potential supplied to the drive circuit and the drive control circuit based on the output potential of the boosting circuit, wherein the first power supply potential and a potential from the bias generating circuit are supplied to the drive circuit that outputs a potential selected from potentials supplied in accordance with a control of the drive control circuit, and wherein in the event of a power supply emergency in which an absolute value between the first and the second power supply potentials is lower than a specified value, the drive control circuit outputs a potential selecting signal that changes all potentials outputted from the drive circuit into the first power supply potential based on the signal activated when the power supply emergency occurs.

In this aspect of the present invention, the operation of the drive circuit in the first-mentioned aspect in the event of a power supply emergency is performed based on the potential selection signals from the drive control circuit.

The drive control circuit preferably comprises:

a logic circuit to which the first and the second power supply potentials are supplied, and outputting various logic levels;

a level shifter group to which a potential from the power supply circuit and the first power supply potential are supplied, including a plurality of level shifters for shifting the logic levels from the logic circuit; and a potential selection circuit for outputting potential selection signals supplied to the drive circuit based on the output from the level shifter group.

This constitution of the drive control circuit ensures that both the first and the second logic levels from the logic circuit after a battery is drawn out become the same ground potential as each other. In this instance, although the output from the level shifter group may become indefinite, this can be controlled as described above, whereby occurrence of malfunctions can be prevented.

Preferably, the level shifter group has an input level setting circuit for setting the input to the level shifters at a specified value based on the signals which become active in the event of a power supply emergency regardless of the output of the logic circuit.

In this manner, indefinite output of the level shifter group can be prevented by setting the input to the level shifters at a specified value in the event of a power supply emergency. Malfunctions can then be prevented by controlling the device in the Nanner described above based on the specified value inputted to the level shifter group.

Preferably, the potential selection circuit has an output level setting circuit for setting the output of the potential selection circuit at a specified value based on the signals which become active in the event of a power supply emergency regardless of the output of the level shifter group.

In this manner, indefinite output of the level shifter group can be prevented by setting the output of the level shifters to a specified value in the event of power supply emergencies. Malfunctions can then be prevented by controlling the device in the manner described above based on the specified value outputted from the level shifters.

In this aspect and the previous aspect of the present invention, the signals activated in the event of a power supply emergency may be outputs from a comparator provided in the semiconductor device or power-on reset signals supplied from outside the semiconductor device.

In still another aspect of the present invention, a semiconductor device including a drive circuit, a drive control circuit which controls the drive circuit, and a power supply circuit which supplies a potential to the drive circuit and drive control circuit, wherein the power supply circuit comprises:

a boosting circuit, to which a first power supply potential which is a ground potential from an external power supply and a second power supply potential which is a potential other than the ground potential are supplied, and raising the absolute value of the second power supply potential and charging the boosted potential to the capacitor; and a bias generating circuit generating a potential supplied to the drive circuit and the drive control circuit based on the output potential of the boosting circuit, and wherein the first power supply potential and a potential from the bias generating circuit are supplied to the drive circuit that outputs a potential selected from potentials supplied in accordance with a control of the drive control circuit during a normal power supply period, and wherein the drive control circuit comprises:

a logic circuit to which the first and the second power supply potentials are supplied, and outputting a first logic level and a second logic level;

a level shifter group to which a potential from the power supply circuit and the first power supply potential are supplied, and shifting an output level from the logic circuit; and a potential selection circuit for outputting potential selection signals supplied to the drive circuit based on the output from the level shifter group, wherein:

each of level shifters forming the level shifter group comprises first and second circuits which are connected in parallel between a supply line for the first power supply potential and a supply line for a potential supplied by the power supply circuit;

the first circuit includes a first MOS transistor of primary conductive-type, a first MOS transistor of secondary conductive-type, and a second MOS transistor of secondary conductive-type which are connected in series to the first circuit, the first logic level from the logic circuit is supplied to gates of the first MOS transistor of primary conductive-type and the first MOS transistor of secondary conductive-type, and a potential between the first MOS transistor of primary conductive-type and the first MOS transistor of secondary conductive-type is a first output potential of each of the level shifters;

the second circuit includes a second MOS transistor of primary conductive-type, a third MOS transistor of secondary conductive-type, and a forth MOS transistor of secondary conductive-type which are connected in series to the second circuit, the second logic level from the logic circuit is supplied to gates of the second MOS transistor of primary conductive-type and the third MOS transistor of secondary conductive-type, and a potential between the second MOS transistor of primary conductive-type and the third MOS transistor of secondary conductive-type is a second output potential of each of the level shifters;

the second output potential is supplied to a gate of the second MOS transistor of secondary conductive-type in the first circuit, and the first output potential is supplied to a gate of the forth KOS transistor of secondary conductive-type; and each of the level shifters further includes a potential maintaining circuit for maintaining the first and the second output potentials of each of the level shifters at a state before occurrence of a power supply emergency, in the event of a power supply emergency in which an absolute value between the first and the second power supply potentials is lower than a prescribed value.

Another cause of malfunction such as instantaneous lighting is a situation where the output from level shifters composing the shift level group becomes indefinite according to the input in the event of a power supply emergency.

According to this aspect of the present invention, in the event of a power supply emergency, the potential maintaining circuit which is provided in each level shifter maintains the first and the second output potentials of the level shifter which existed prior to the occurrence of a power supply emergency. As a result, the output of the level shifter group does not become indefinite at the time of a power supply emergency, whereby malfunctions due to a power supply emergency can be prevented.

The potential maintaining circuit provided in each of the level shifters forming the level shifter group may comprise:

a third KOS transistor of primary conductive-type connected in parallel with the first MOS transistor of primary conductive-type; and a forth MOS transistor of primary conductive-type connected in parallel with the second KOS transistor of primary conductive-type.

In this instance, the second output potential may be supplied to a gate of the third MOS transistor of primary conductive-type, and the first output potential may be supplied to a gate of the fourth MOS transistor of primary conductive-type.

This constitution ensures that both the first and the second logic levels from the logic circuit become the same ground potentials as each other, after a battery is drawn out, for instance. In this instance,both the first and the second MOS transistors of primary conductive-type of the level shifter are either "on" or "off".

The potential maintaining circuit turns either one of the third and fourth NOS transistors of primary conductive-type "on" and the other "off" at the time of a power supply emergency. Specifically, when the state of first MOS transistor of primary conductive-type after a power supply emergency varies from the state before the power supply emergency, the first output potential causes the state of the third MOS transistor of primary conductive-type connected in parallel to be identical to the state of the first MOS transistor of primary conductive-type before the power supply emergency. In the same manner, when the state of the second MOS transistor of primary conductive-type after a power supply emergency varies from the state that existed before the power supply emergency, the second output potential causes the state of the fourth MOS transistor of primary conductive-type connected in parallel to become identical to the state of second MOS transistor of primary conductive-type before the power supply emergency. The first and the second output potentials from the level shifter before and after a power supply emergency can be maintained equivalent by this action. The previous output conditions can thus be maintained even when the first and the second logic levels from the logic circuit take the same logic conditions. Therefore, the first and the second output potentials from the level shifter can be fixed after a cutoff of the power supply. Thus, the drive circuit may cause all output potentials to become identical, for example, to the first power supply potential, whereby occurrence of malfunctions can be prevented.

It is preferable that the potential maintaining circuit provided in at least one of the level shifters forming the level shifter group includes a third MOS transistor of primary conductive-type connected in parallel to the first HOS transistor of primary conductive-type, and, when an on/off state of the first MOS transistor of primary conductive-type changes before and after the power supply emergency, the on/off state of the third MOS transistor of primary conductive-type is set identical to an on/off state of the first MOS transistor of primary conductive-type which existed before the power supply emergency.

The on/off state of the first MOS transistor of primary conductive-type varies before and after the power supply emergency in at least one level shifter. In this instance, malfunctions can be prevented by setting the state of the third MOS transistor of primary conductive-type connected in parallel to the first MOS transistor of primary conductive-type to a state identical to that of the first MOS transistor of primary conductive-type before the power supply emergency.

It is preferable that the potential maintaining circuit provided in at least one of the level shifters forming the level shifter group includes a fourth MOS transistor of primary conductive-type connected in parallel to the second MOS transistor of primary conductive-type, and, when an on/off state of the second KOS transistor of primary conductive-type changes before and after the power supply emergency, the on/off state of the fourth MOS transistor of primary conductive-type after the power supply emergency is set identical to an on/off state of the second MOS transistor of primary conductive-type before the power supply emergency.

The on/off state of the second MOS transistor of primary conductive-type varies before the power supply emergency in at least one level shifter. In this instance, malfunctions can be prevented by setting the state of the third MOS transistor of primary conductive-type connected in parallel to the second MOS transistor of primary conductive-type to a state identical to that of the second MOS transistor of primary conductive-type before the power supply emergency.

The present invention can be applied to a liquid crystal device and electronic equipment using the above-described semiconductor device, and can reliably prevent malfunctions which may occur in the case of a power supply emergency, such as the case where a battery is taken out.

DESCRIPTION OF PREFERRED EMBODIMENT

Embodiments of the present invention will be explained with reference to the drawings.

<Liquid crystal device>

Figure 1:
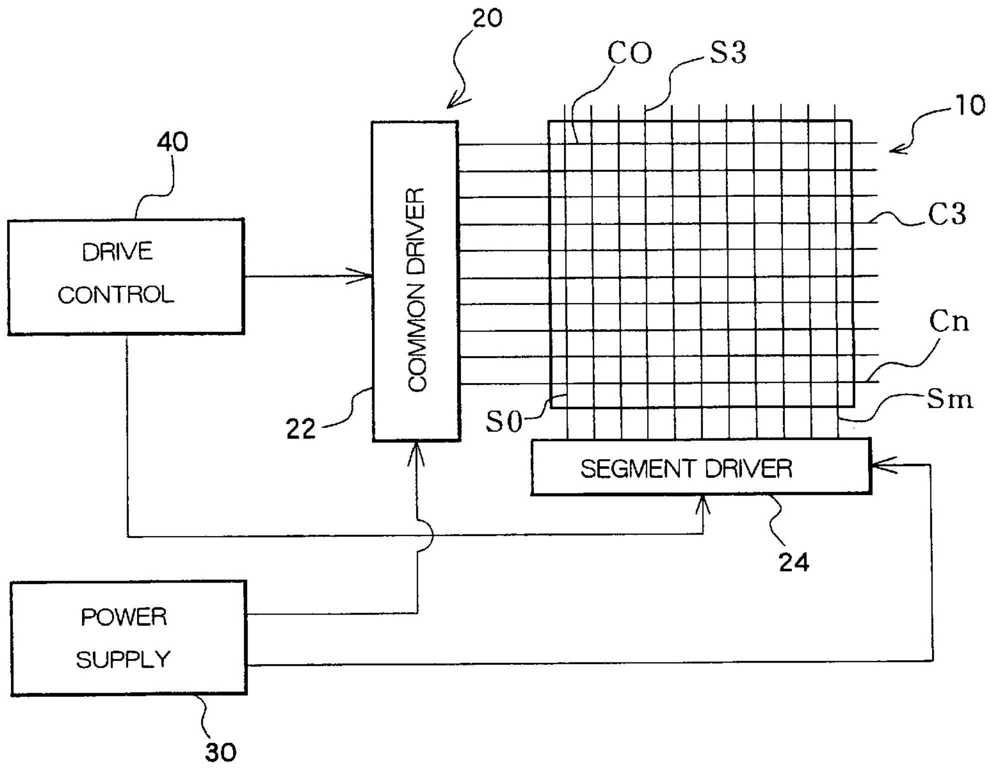
FIG. 1 is a schematical explanation showing an outline of the liquid crystal device of the present invention.
Figure 2:
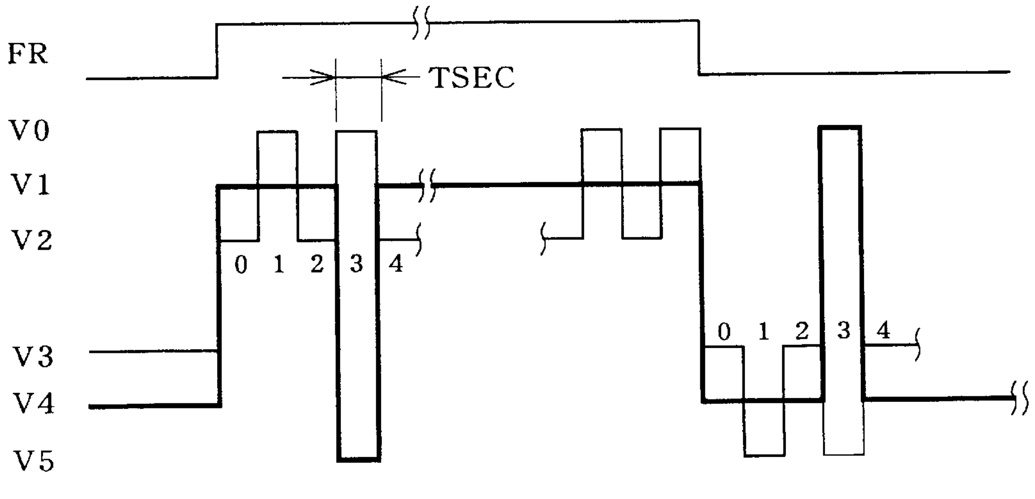
FIG. 2 is a waveform chart showing a drive waveform supplied to the liquid crystal panel shown in FIG. 1.

FIG. 1 shows a constitution of major parts of a liquid crystal device, and FIG. 2 is an example of a waveform chart showing a drive waveform for driving the liquid crystal panel of FIG. 1.

In FIG. 1, a liquid crystal panel, for example, a simple matrix pattern liquid crystal panel 10, is formed by sealing liquid crystals between a first substrate in which common electrodes C0 to Cm are formed, and a second substrate in which segment electrodes S0 to Sn are formed. The point at which one common electrode and one segment electrode cross is a display pixel. The liquid crystal panel 10 has (m+1)×(n+1) display pixels.

Any other liquid crystal panel such as an active matrix pattern liquid crystal display panel can be used instead of the simple matrix pattern liquid crystal panel 10 in this example.

As a drive circuit 20 which drives the liquid crystal panel 10, a common driver 22 connected with the common electrodes C0 to Cm, and a segment driver 24 connected with the segment electrodes S0 to Sn are provided. The common driver 22 and segment driver 24 are supplied with a prescribed voltage from a power supply circuit 30, and selectively supply this prescribed voltage to the common electrodes C0 to Cm or the segment electrodes S0 to Sn in accordance with signals from the drive control circuit 40.

FIG. 2 shows an example of a drive waveform during a frame period in which the common electrode C3 in the liquid crystal panel 10 in FIG. 1 is selected.

In FIG. 2, the thick solid line indicates the drive waveform supplied to each of the common electrodes C0 to cm from the common driver 22, whereas the thin solid line indicates the drive waveform supplied to each of the segment electrodes S0 to Sn from the segment driver 24.

The polarity of the voltage applied to the liquid crystal in FIG. 2 is inverted from positive to negative, or vice versa, according to the polarity conversion signal FR. For this reason, six levels of drive potential V0 to V5 are used.

As shown in FIG. 2, the drive waveform supplied by the common driver 22 varies among the potentials V0, V1, V4, and V5. On the other hand, the drive waveform supplied by the segment driver 24 varies among the potentials V0, V2, v3, and V5.

<Constitution of semiconductor device>

Figure 3:
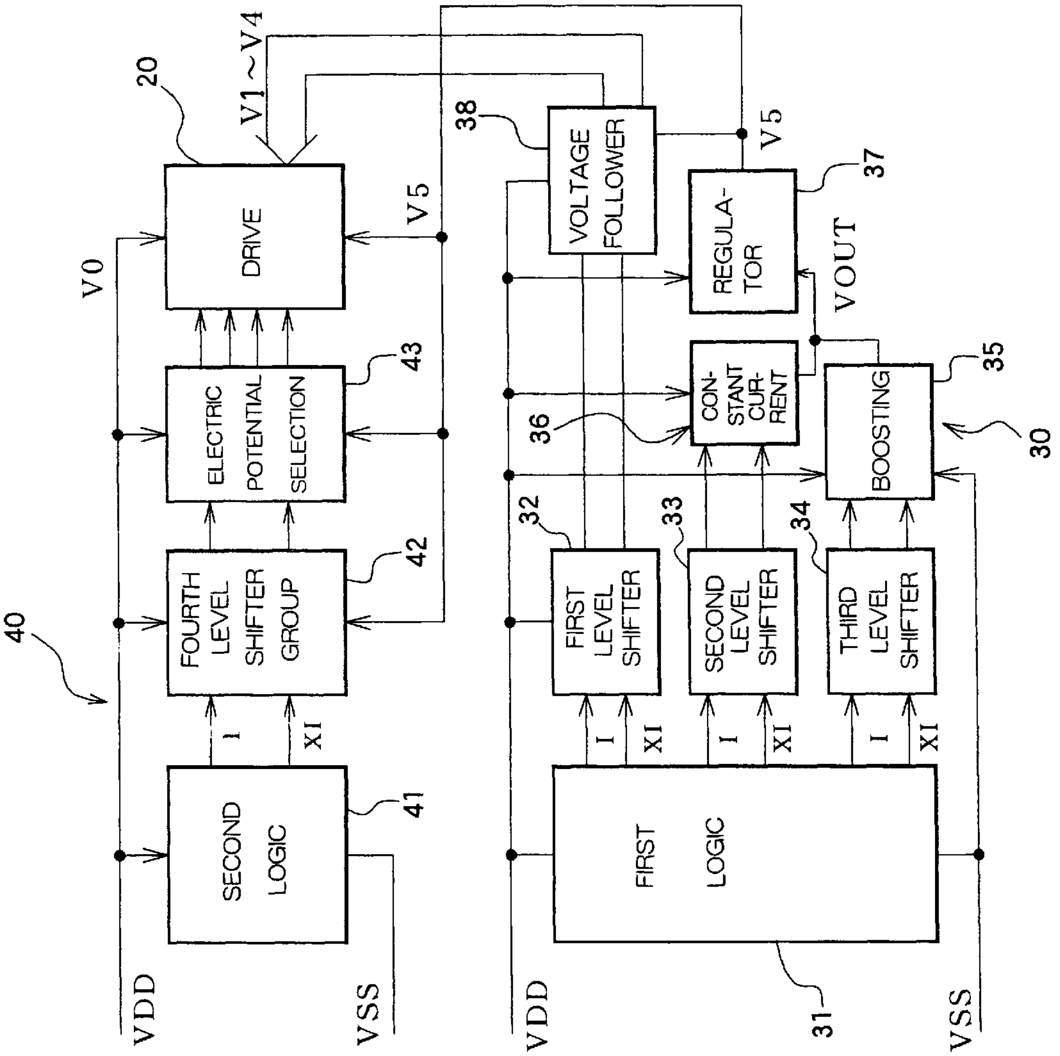
FIG. 3 is a block diagram of the single chip semiconductor device, on which a drive circuit, a drive control circuit, and a power supply circuit of FIG. 1 are mounted.

FIG. 3 shows details of a single chip semiconductor device comprising a drive circuit 20, a power supply circuit 30, and a drive control circuit 40 of FIG. 1. The present invention can be applied also to a configuration in which the drive circuit 20, power supply circuit 30, and drive control circuit 40 are mounted on a plurality of chips respectively.

In this embodiment of the present invention the first power supply potential to VDD is set VDD=V0. The power supply circuit 30 produces V1 to V5 based on the first power supply potential VDD and the second power supply potential VSS.

The power supply circuit 30 has a first logic circuit 31, first to third level shifters 32 to 34, a boosting circuit 35, a constant current circuit 36, a regulator 37, and a voltage follower circuit 38. The constant current circuit 36, regulator 37, and voltage follower circuit 38 function as a bias generating circuit.

On the other hand, the drive control circuit 40 has a second logic circuit 41, a fourth level shifter group 42, and a potential selection circuit 43.

The first to third level shifters 32 to 34 shift the levels of the logic output I and the inverted output XI of the first logic circuit 31, and the fourth level shifter group 42 shifts the levels of the logic output I and the inverted output XI of the second logic circuit 41.

The potential selection circuit 43 in the drive control circuit 40 sends signals to the drive circuit 20 instructing which of the potentials V0 to V5 should be supplied to the common electrode and the segment electrode according to the outputs from the fourth level shifter group 42.

In this embodiment, |VDD−VSS|=3V, for example, VDD=V0 and VSS=−3V. The voltage applied to the liquid crystal differs according to the drive duty. For example, if the duty is $1/32$, 5V to 7V is required, and if the duty is $1/64$, 8V to 12V is required. In either case, the voltage is insufficient if |VDD−VSS|=3V.

Figure 4:
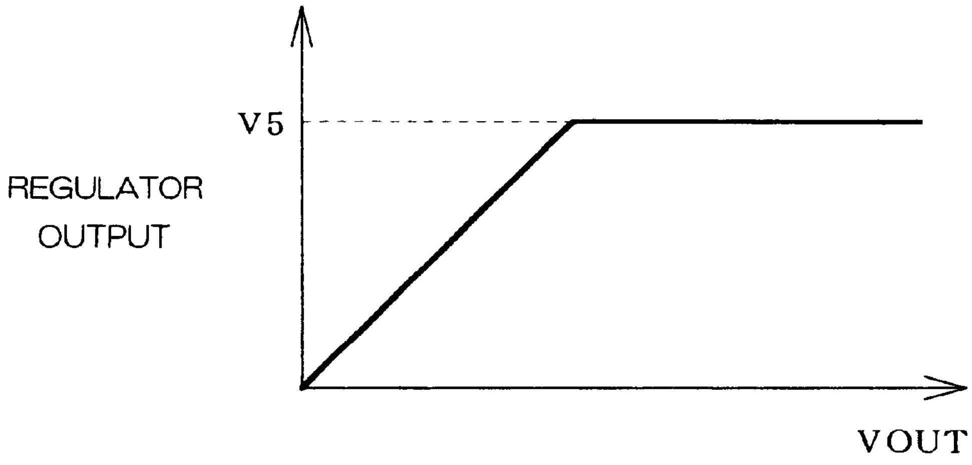
FIG. 4 is a chart showing the output characteristics of the regulator of FIG. 3.
Figure 6:
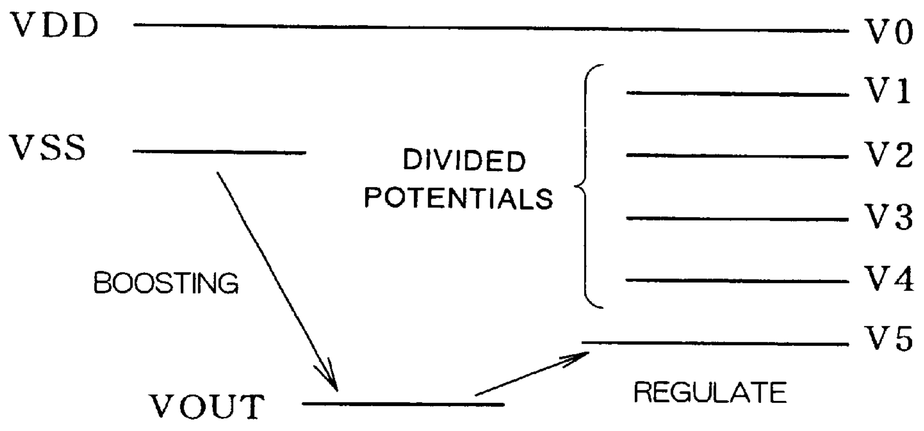
FIG. 6 is a chart illustrating operations of the boosting circuit, regulator, and voltage follower circuit shown in FIG. 3.

Therefore, a boosting circuit 35 and a constant current circuit 36 are provided in the drive circuit 30, to boost |VDD−VSS|=3V and produce VOUT. In the present embodiment, VOUT=−9V. As shown in FIG. 4, the regulator 37 produces a stable constant potential V5 based on the VOUT. In addition, in the voltage follower circuit 38, the first power supply potential VDD=V0 and the potential V5 from the regulator 37 are divided, for example, into potentials V1 to V4. These operations are schematically shown in FIG. 6.

Figure 5:
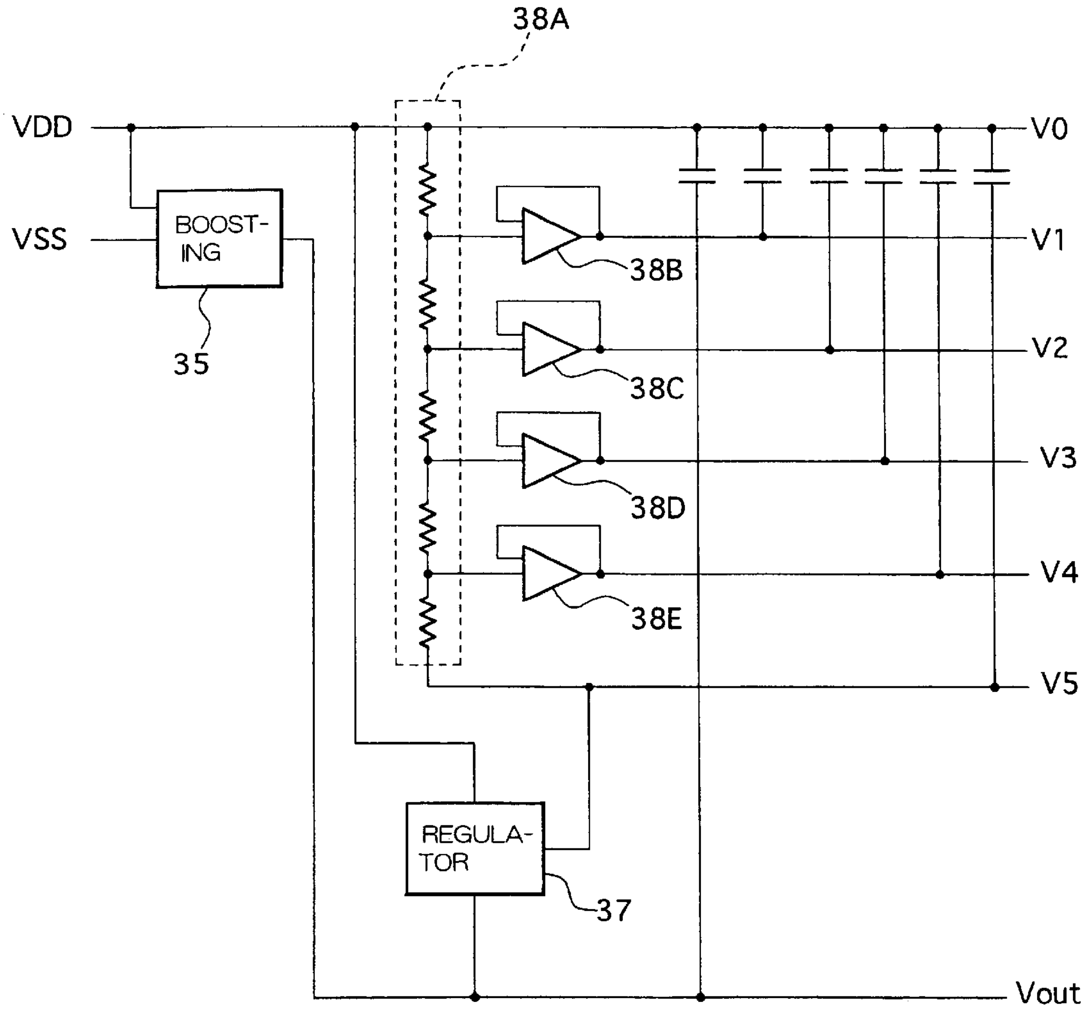
FIG. 5 is a circuit chart showing the voltage follower circuit shown in FIG. 3.

To produce the voltages V1 to V4, the voltage follower circuit 38 has a resistance dividing circuit 38A and first to fourth differential amplifiers 38B to 38E as shown in FIG. 5, for example. A capacitor is provided between the supply line for voltage V0 and each of the supply lines for voltages V1 to V5 and Vout.

<Cause of instantaneous lighting>

(Conventional constitution of the fourth level shifter group and the potential selection circuit)

Figure 7:
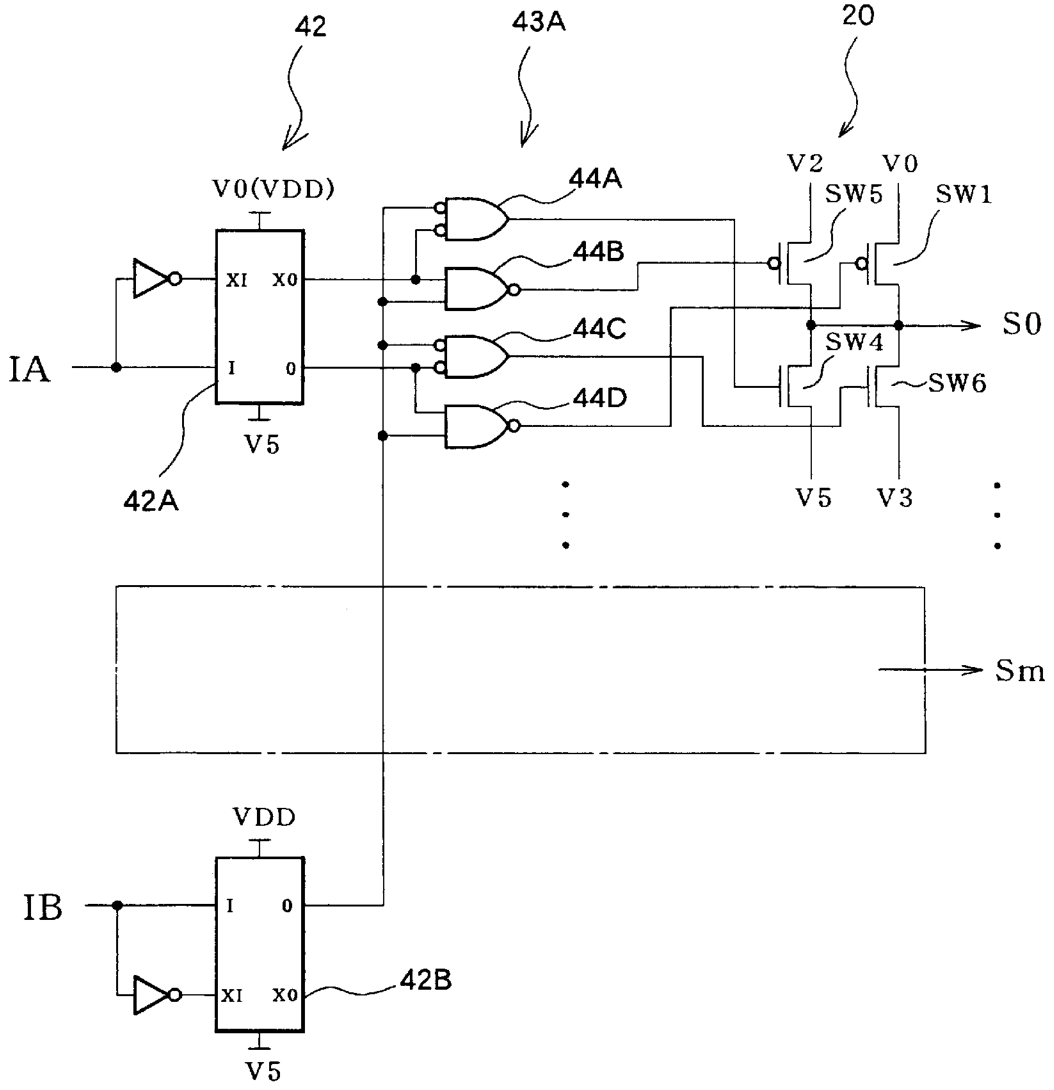
FIG. 7 is a circuit chart of a conventional segment electrode drive system.
Figure 8:
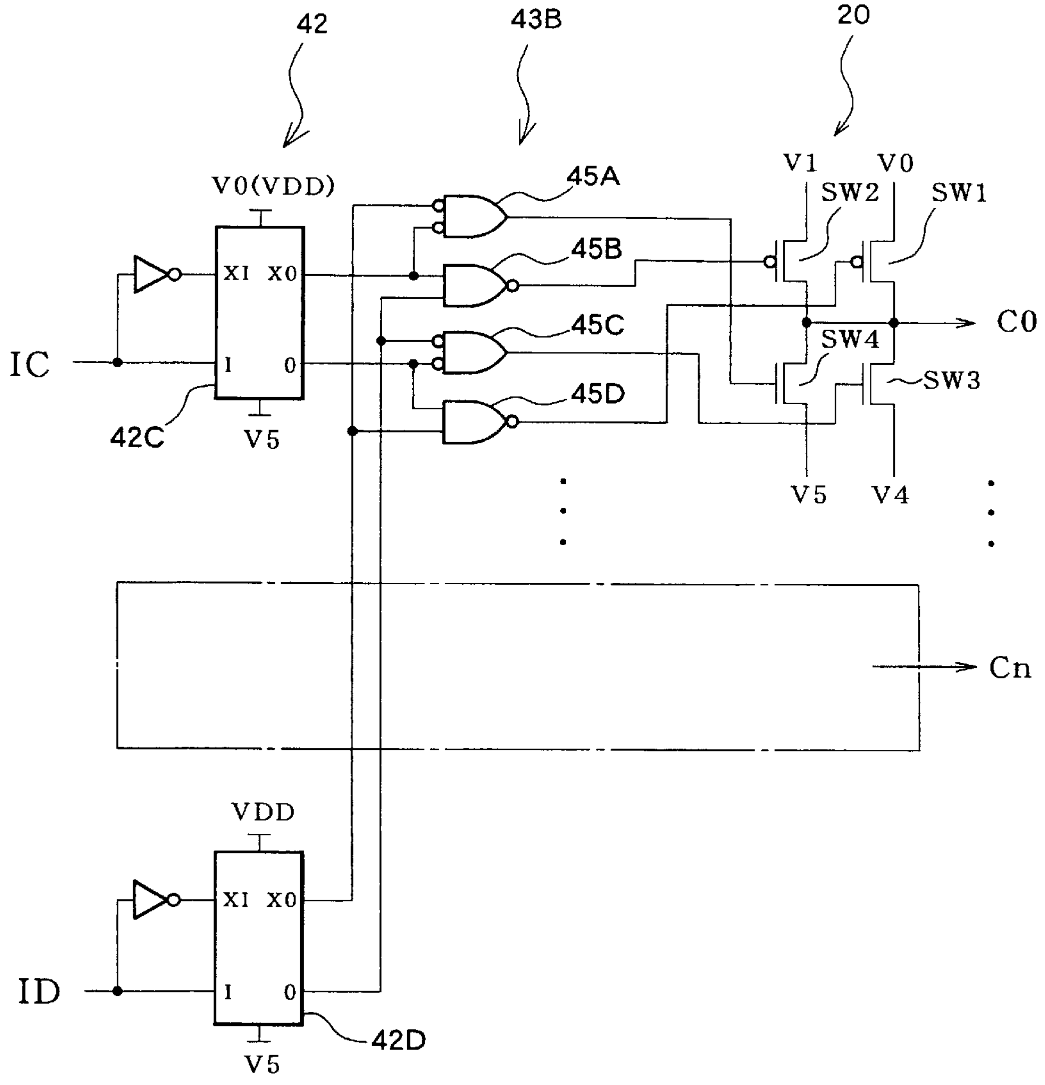
FIG. 8 is a circuit chart of a conventional common electrode drive system.

Conventional constitutions of the fourth level shifter group 42 and the potential selection circuit 43 shown in FIG. 3 will now be described referring to FIGS. 7 and 8. FIG. 7 shows a constitution of a circuit for supplying voltage to the segment electrodes S0 to Sm of the display part 10, and FIG. 8 shows a constitution of a circuit for supplying voltage to the common electrodes C0 to Cn of the display part 10.

In FIG. 7, a level shifter 42A, a potential selection block 43A, and switches SW1, SW4 to SW6 are provided as a voltage supply system for one segment electrode. In addition, a level shifter 42B which is common to the supply system for all segment electrodes is provided in the circuit of FIG. 7. The potential selection block 43A is provided with first to fourth logic gates 44A to 44D which controls turning on and off of the switches SW1 and SW4 to SW6 according to the outputs of the level shifters 42A and 42B.

The relationship between the logic of input signal IA (the signal input to the input terminal I of the level shifter 42A) and input signal IB (the signal input to the input terminal I of the level shifter 42B), and the voltage supplied to the segment electrode is shown in Table 1.

TABLE 1

| | | | | |
|---|---|---|---|---|
| IA | H | H | L | L |
| IB | L | H | L | H |
| SEG | V5 | V0 | V3 | V2 |

On the other hand, the system supplying voltage to one common electrode shown in FIG. 8 is provided with a level shifter 42C, a potential selection block 43B, and switches SW1 to SW4. A level shifter 42D which is common to the supply system for all common electrodes is also provided in the constitution of FIG. 8. The potential selection block 43B is provided with first to fourth logic gates 45A to 45D which controls turning on and off of the switches SW1 to SW4 according to the outputs of the level shifters 42C and 42D.

The relationship between the logic of input signal IC (the signal input to the input terminal I of the level shifter 42C) and input signal ID (the signal input to the input terminal I of the level shifter 42D), and the voltage supplied to the common electrode is shown in Table 2.

TABLE 2

| | | | | |
|---|---|---|---|---|
| IC | H | H | L | L |
| ID | L | H | L | H |
| COM | V0 | V5 | V4 | V1 |

(constitution of each level shifter in the fourth level shifter group).

Figure 9:
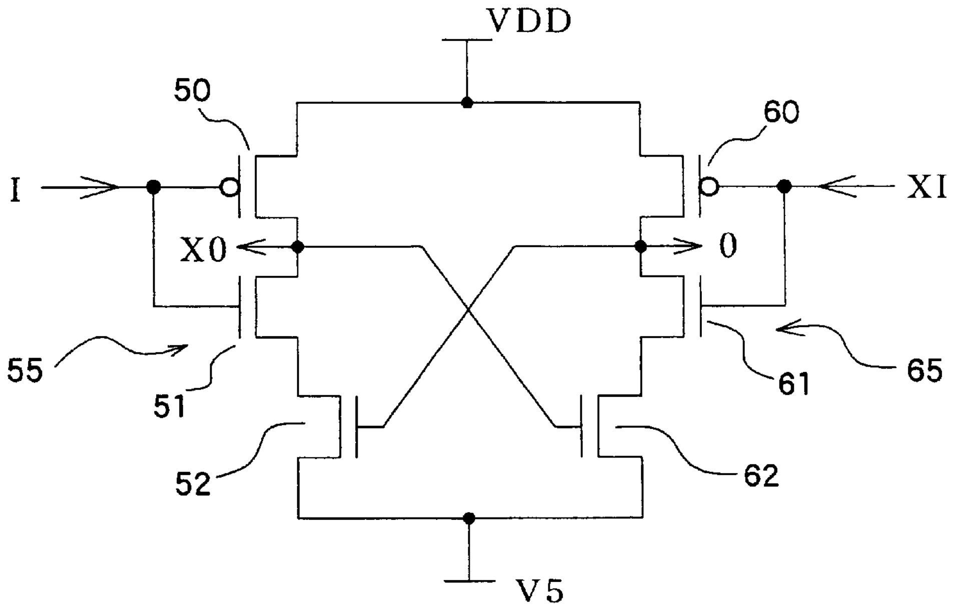
FIG. 9 is a level shifter circuit chart of the level shifter group of FIG. 3.

The level shifters 42A to 42D, etc. which constitutes the fourth level shifter group shown in FIG. 3 will now be described referring FIG. 9. As shown in FIG. 9, the level shifters constituting the fourth level shifter group has first and second circuits 55 and 65 connected in parallel to each other. A first P-type MOS transistor 50, a first N-type MOS transistor 51, and a second N-type MOS transistor 52 are connected in series between the supply line of the first power supply potential VDD (=V0) and the supply line of the potential V5, thereby forming a first circuit 55. An output I from the second logic circuit 41 shown in FIG. 2 is supplied to the gate of the first P-type MOS transistor 50 and the gate of the first N-type MOS transistor 51.

Parallel to these transistors 50 to 51, a second P-type MOS transistor 60, a third N-type MOS transistor 61, and a fourth N-type MOS transistor 62 are connected in series, whereby a second circuit 65 is formed. An inverted output XI from the second logic circuit 41 shown in FIG. 2 is supplied to the gate of the second P-type MOS transistor 60 and the gate of the third N-type MOS transistor 61.

Here, the potential between the first P-type MOS transistor 50 and the first N-type MOS transistor 51 in the inverted output XO of the level shifter 42, and the potential between the second P-type NOS transistor 60 and the third N-type MOS transistor 61 is the output O of the level shifter 42. The inverted output XO is supplied to the gate of the fourth N-type NOS transistor 62, and the output O is supplied to the gate of the second N-type MOS transistor 52.

(operation of the fourth level shifter group)

Next, operation of the level shifter group shown in FIG. 9 will be described.

Input-output characteristics of the level shifter shown in FIG. 9 are shown in the following Table 3.

TABLE 3

| Input I | Input XI | Output O |
|---|---|---|
| H (VDD) | L (VSS) | H (VDD) |
| L (VSS) | H (VDD) | L (V5) |
| H (VDD) | H (VDD) | Indefinite |
| L (VSS) | L (VSS) | Indefinite |

I=XI=H (VDD) or I=XI=L (VSS) in Table 3 indicates the state when the power supply is forcibly shut-off, such as the case where the battery is drawn out. In the case where VDD=OV and VSS=−3V are satisfied, the equation I=XI=VDD=OV is effective when the power supply is forcibly shut-off.

Assuming that I=H (VDD) and XI=L (VSS) are satisfied before forcible shut-off of the power supply in the level shifter shown in FIG. 9, what will happen when the power supply is forcibly shut-off will be discussed.

In this instance, if the power supply is forcibly shut-off, the input(I) from the second logic circuit 41 will become I=XI=H (VDD), the second P-type MOS transistor 60 turns "off" from "on", and the third N-type MOS transistor 61 turns "on" from "off". Although V5 generated from VOUT shown in FIG. 2 also changes to VDD, this change from V5 to VDD (V5→VDD) is slower than the change from VSS to VDD (VSS→VDD).

The reason will be discussed referring to FIG. 10 which shows details of a conventional triple boosting circuit 35.

Figure 10:
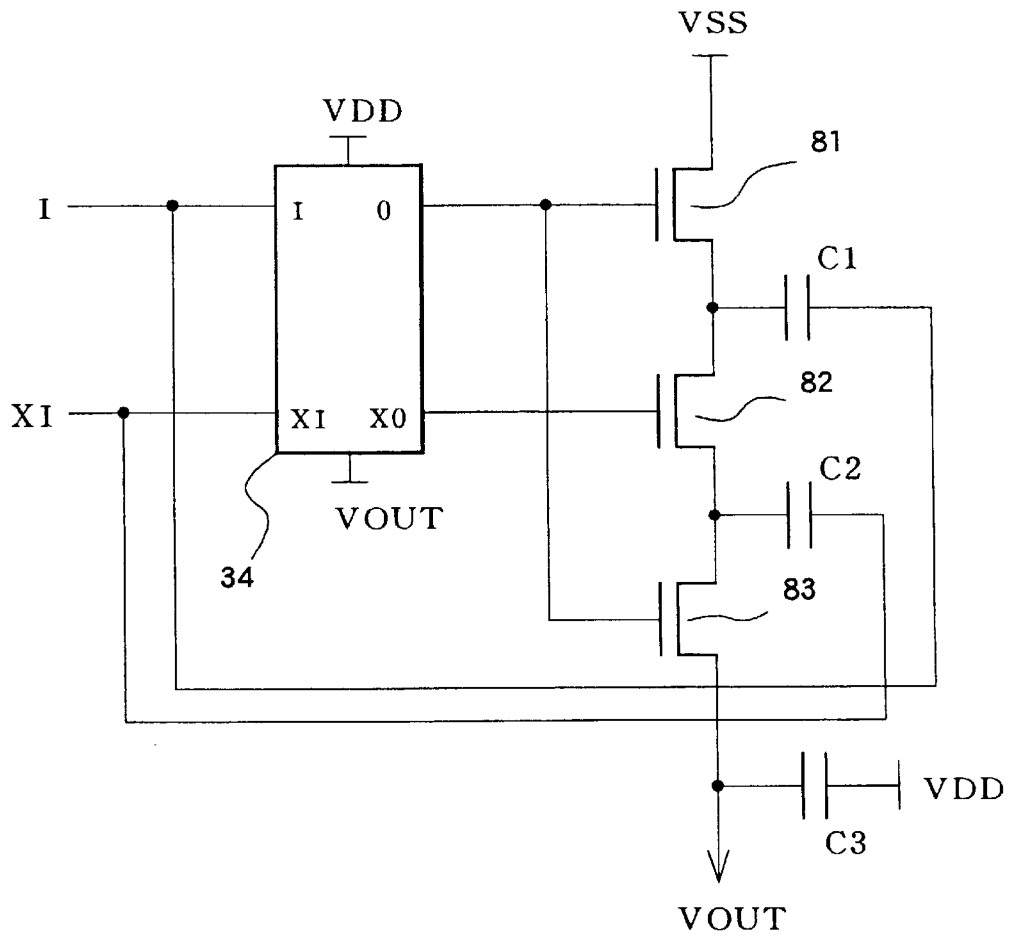
FIG. 10 is a circuit chart showing an example of the boosting circuit of FIG. 3.

In FIG. 10, an output O of the third level shifter 34 is supplied to the gates of the first and third N-type MOS transistors 81 and 83, and an output XO of the third level shifter 34 is supplied to the gate of the second N-type MOS transistor 82.

This boosting circuit 35 has capacitors C1 to C3 which are charged by N to type MOS transistors 81 to 83, of which on/off operation is controlled by the output O and output XO of the third level shifter 34. The output potential VOUT is determined by the amount of the charge provided to the capacitor C3.

If the power supply is forcibly shutoff, the capacitor C3 is discharged. The speed of discharge, however, is so slow that discharge will not be completed after the first and the second power supply potentials VDD and VSS become equivalent. Because a potential V5 is generated by a potential VOUT, this potential V5 also does not become equivalent to VDD (=0V) immediately according to the effect of the charge in the capacitor C3.

Figure 18:
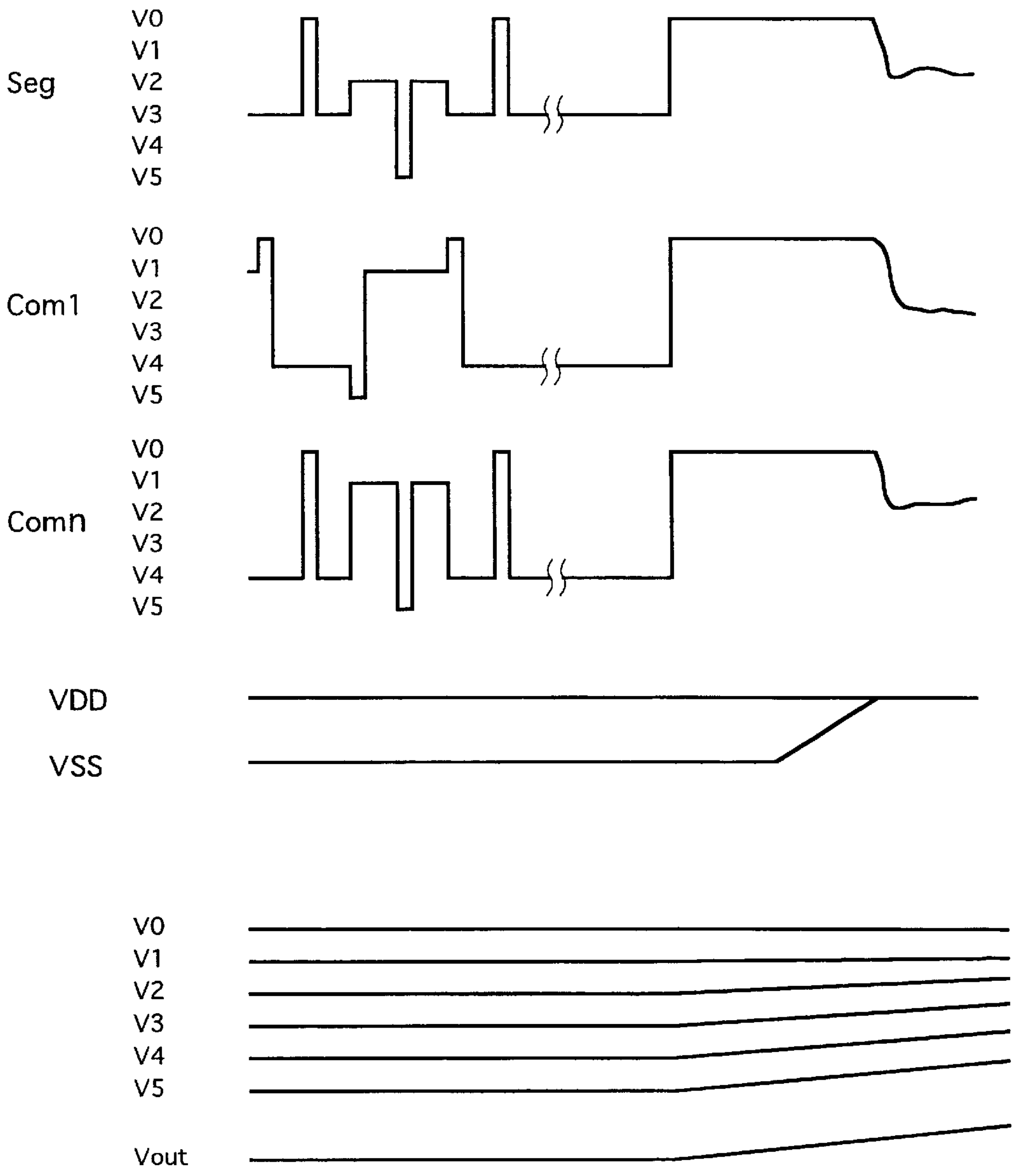
FIG. 18 is a timing chart for illustrating instantaneous lighting malfunctions.

Here, it is assumed that before forced shut-off of the power supply the input of level shifters 42A, 42B shown in FIG. 7 are IA=IB=H, the input of level shifters 42C, 42D shown in FIG. 8 are IC=H, ID=L, and the segment electrode and common electrode are provided with a potential V0=VDD as shown in FIG. 18.

When the power supply is shut-off, both the inputs I and XI of level shifters 42A to 42D will become HIGH, because there is no logic power supplied to the second logic circuit 41 which is shown in FIG. 3. Thus, the output O of each level shifter 42A to 42D will become indefinite as shown in Table 3. For this reason, the potential V0, which has been selected to be supplied to the segment electrode and common electrode, changes to the other potential (see FIG. 18), whereby the phenomenon of instantaneous lighting occurs in the liquid crystal panel 10 shown in FIG. 1.

When the power supply is cut off, the output data V0 from each shift register is refreshed as capacitors are discharged, in the same manner as in the dynamic data holding action in DRAM where data left in the capacitor is held. This is equivalent to the action of dynamically holding data.

Specifically, the potential of the output O is decreased to an intermediate level by the on/off operations of the second P-type Mos transistor 60 and the third N-type MOS transistor 61 which are shown in FIG. 9. Finally, the second N-type MOS transistor 52 is turned "off" from "on". The potential of the output XO thus increases.

This causes the gate potential of the first to sixth switches (MOS transistor) SW1 to SW6 of the drive circuit 20 shown in FIGS. 7 and 8 to change via the potential selection circuit 43. However, the potential V1 to V5 are not completely discharged due to the effects of the capacitor C2. The above-mentioned instantaneous lighting will occur for these reasons.

<Countermeasure against instantaneous lighting>

(Countermeasure against instantaneous lighting in the fourth level shifter group)

Figure 11:
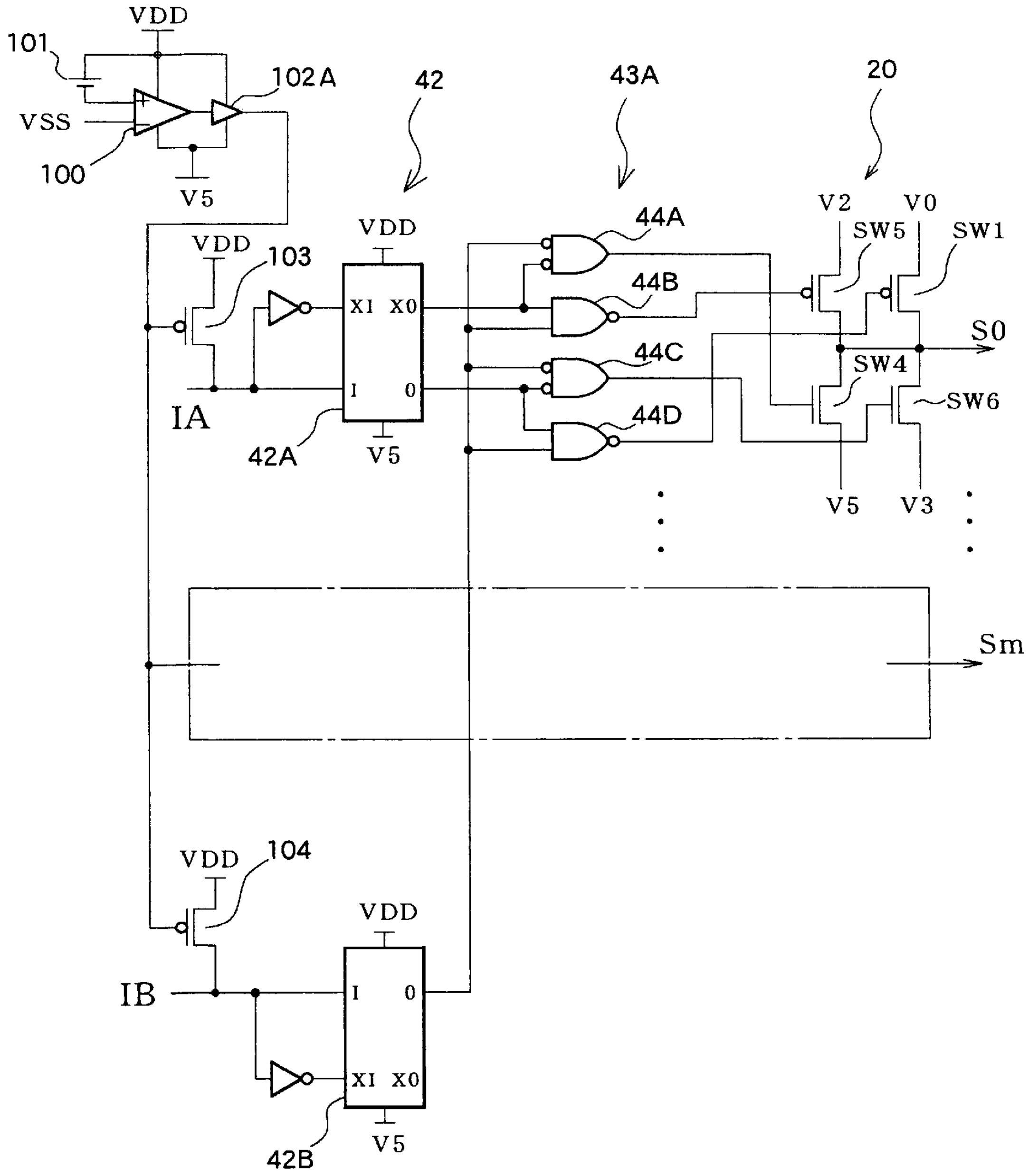
FIG. 11 is a circuit chart of the segment electrode drive system according to an embodiment of the present invention.
Figure 12:
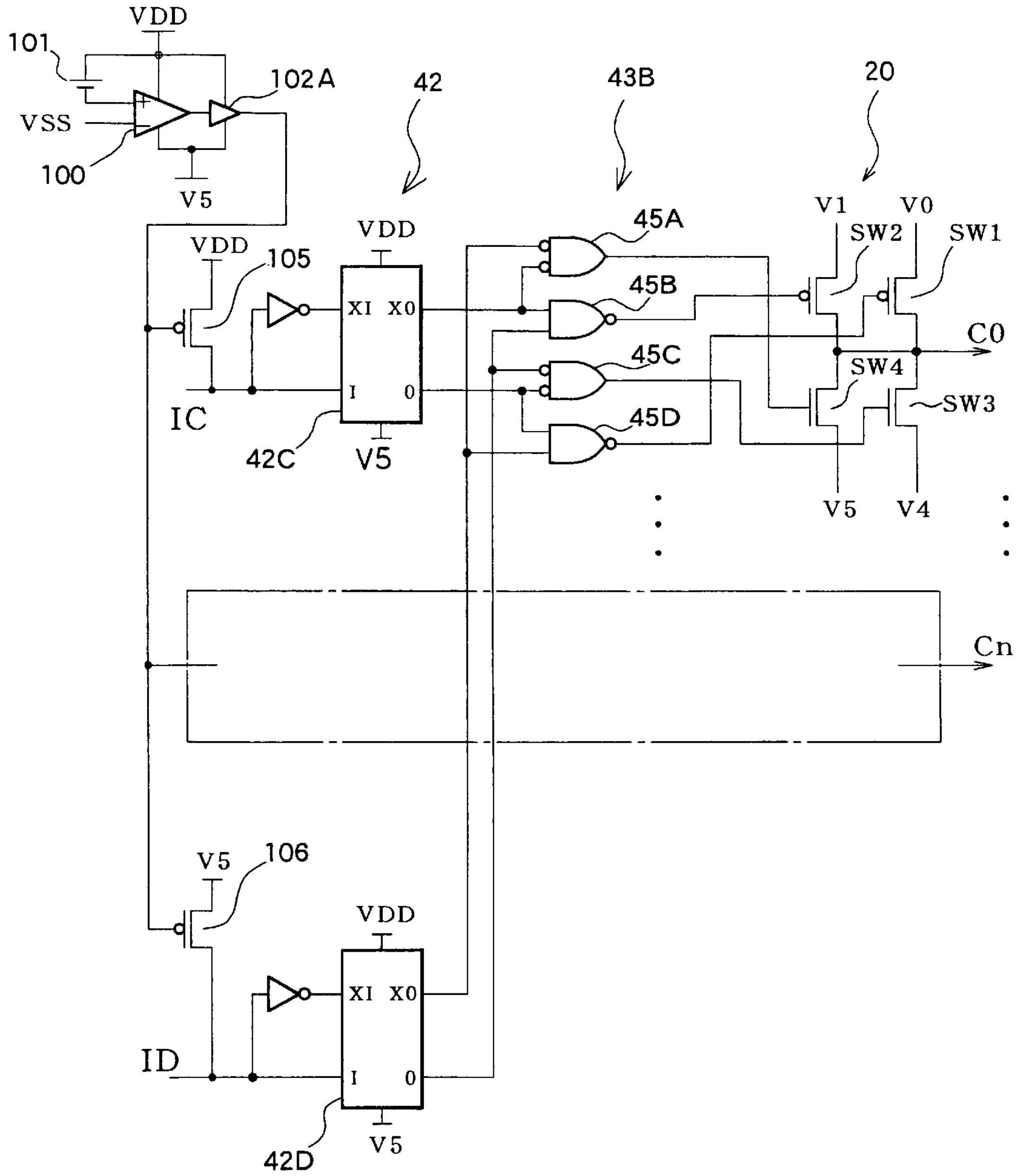
FIG. 12 is a circuit chart of the common electrode drive system according to the embodiment of the present invention.

FIGS. 11 and 12 show segment and common electrode systems in the embodiment of the present invention, in which improved level shifters are used rather than the conventional level shifters shown in FIGS. 7 and 8.

In FIGS. 11 and 12, the segment electrode drive system and common electrode drive system are provided with a comparator 100, a reference potential generating circuit 101, and a buffer 102A, all used in common with these drives.

A P-type MOS transistor 103 is provided between an input line connected to the input terminal I of the level shifter 42A and a supply line for the first power supply potential VDD, as shown in FIG. 11. In the same manner, a P-type MOS transistor 104 is provided between an input line connected to the input terminal I of the level shifter 42B and a supply line for the first power supply potential VDD, as shown also in FIG. 11.

On the other hand, a P-type MOS transistor 105 is provided between an input line connected to the input terminal I of the level shifter 42C and a supply line for the first power supply potential VDD, as shown in FIG. 12. In the same manner, a P-type MOS transistor 106 is provided between an input line connected to the input terminal I of the level shifter 42D and a supply line for the first power supply potential VDD, as shown also in FIG. 12.

A reference potential VREG is input to the input terminal of the comparator 100, whereas a second power supply potential VSS is input to the inverted input terminal. The reference potential VREG is produced in the reference potential generating circuit 101 based on the first power supply potential VDD (=0V). VREG is −1.8V, for example. The reference potential generating circuit 101 is made up of one or more N-type MOS transistors which are connected in series and can produce the reference potential VREG by causing the voltage of the first power supply potential VDD to be reduced by the threshold voltage Vth of each transistor.

As the output of the comparator 100, HIGH (VDD) is outputted under normal conditions in which the second paver supply potential VSS is lower than the reference potential VREG, and LOW (V5) is outputted in the case such as when the power supply is forcibly cut off, in which case the second power supply potential VSS is higher than the reference potential VREG. The output of the buffer 102A is also HIGH (VDD) when the power supply potential is normal, and is LOW (V5) when the power supply potential is abnormal.

The comparator 100, reference potential generating circuit 101, and buffer 102A do not necessarily have to be provided in the semiconductor device with the power supply circuit 30 and the like mounted thereon. Instead of using the output from the buffer 102A, it is possible to supply pour-on-reset signals from outside the semiconductor device to the gate of the fourth P-type MOS transistor 63. The power-on-reset signals are detector outputs which always detect potentials of external power supplies and become active when the power supply potential falls below a prescribed value. Therefore, if the power-on-reset signal is LOW active, this is equivalent to the output of the buffer 102A.

When the power supply potential is not normal, the output of the buffer 102A becomes LOW (V5) and all four P-type MOS transistors 103 to 106 are turned on, as mentioned above. Therefore, regardless of the logic of signals IA to ID, HIGH (VDD) is inputted in the input terminal I of the level shifters 42A to 42C and Low (V5) is inputted to the input terminal XI. In addition, LOW (V5) is inputted in the input terminal I of the level shifter 42D and HIGH (VDD) is input to the input terminal XI.

Therefore, when the power supply potential is not normal, all switches SW5 to SW6 may set "off", leaving only the switch SW1 "on" by turning only the fourth logic gate 44D "on" in FIG. 11. According to this embodiment the present invention, it is possible to cause the drive circuit 20 to supply the potential V0 (=VDD) to all segment electrodes shown in FIG. 3 by forcibly setting the level shifters 42A and 42B to input (I, XI)=(H, L), when the power supply potential is not normal.

In the same manner, when the power supply potential is not normal, all switches SW2 to SW4 may set "off", leaving only the switch SW1 "on" by turning only the fourth logic gate 45A "on" in FIG. 12. According to this embodiment of the present invention, it is possible to cause the drive circuit 20 to supply the potential V0 (=VDD) to all common electrodes shown in FIG. 3 by forcibly setting the level shifter 42D to input (I, XI)=(H, L), when the power supply potential is not normal.

Accordingly, when the power supply potential is not normal, malfunctions such as instantaneous lighting of the liquid crystal panel 10 can be prevented by providing all of the segment electrodes and common electrodes with the potential V0 (=VDD=0V).

However, it is preferable that P-type MOS transistors 103 to 106 have a low "ON" resistance (a high capacity).

Furthermore, to prevent occurrence of the cases in which two switches among the switches SW1 and SW4 to SW6 in the segment electrode drive system are simultaneously "on" or two switches among the switches SW1 to SW4 in the common electrode drive system are simultaneously "on", it is desirable to provide a period of time during which all switches SW1 to SW6 are turned off.

(Countermeasure against instantaneous lighting in the potential selection circuit 43)

Figure 14:
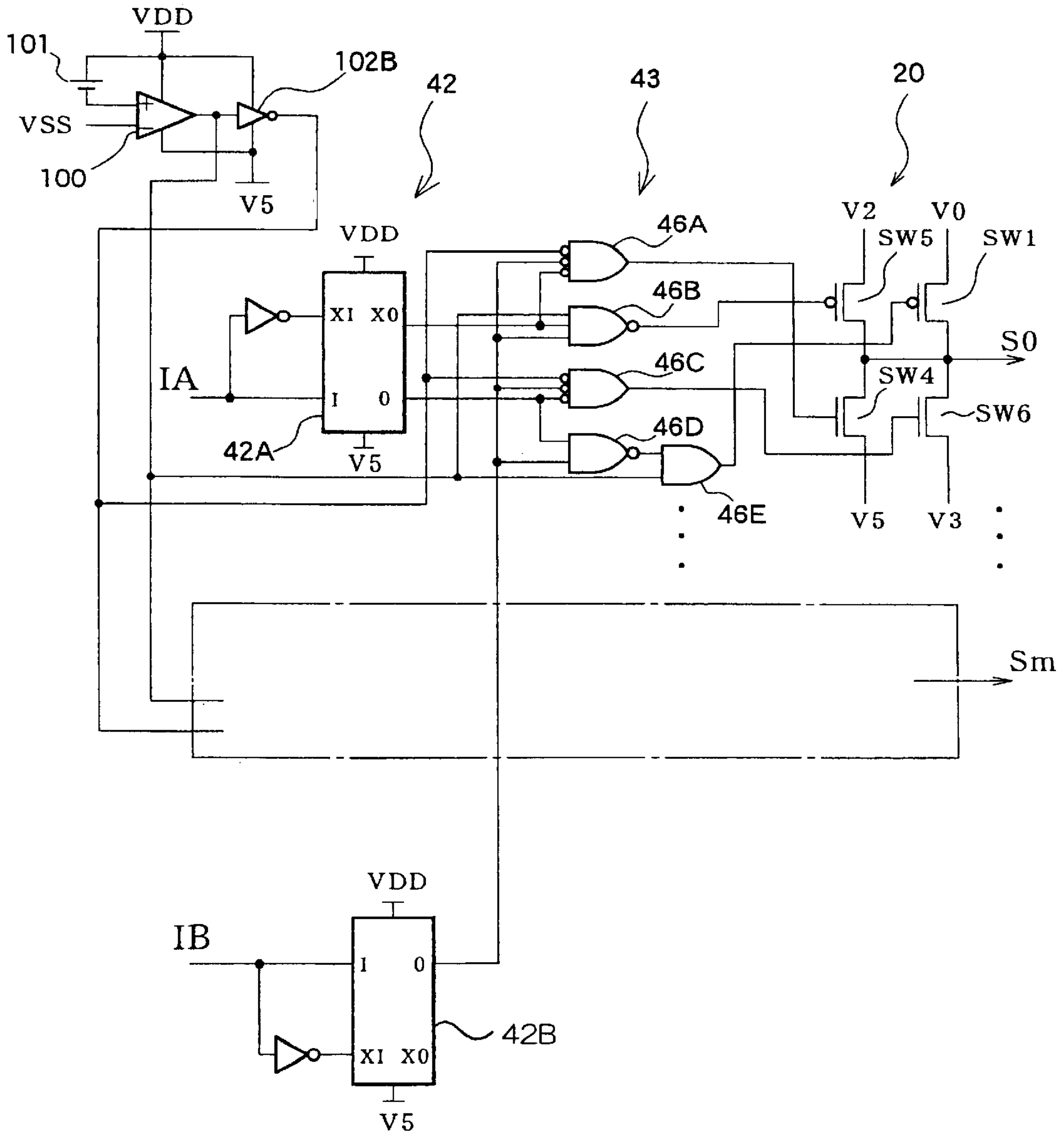
FIG. 14 is a circuit chart of the segment electrode drive system according to another embodiment of the present invention.
Figure 15:
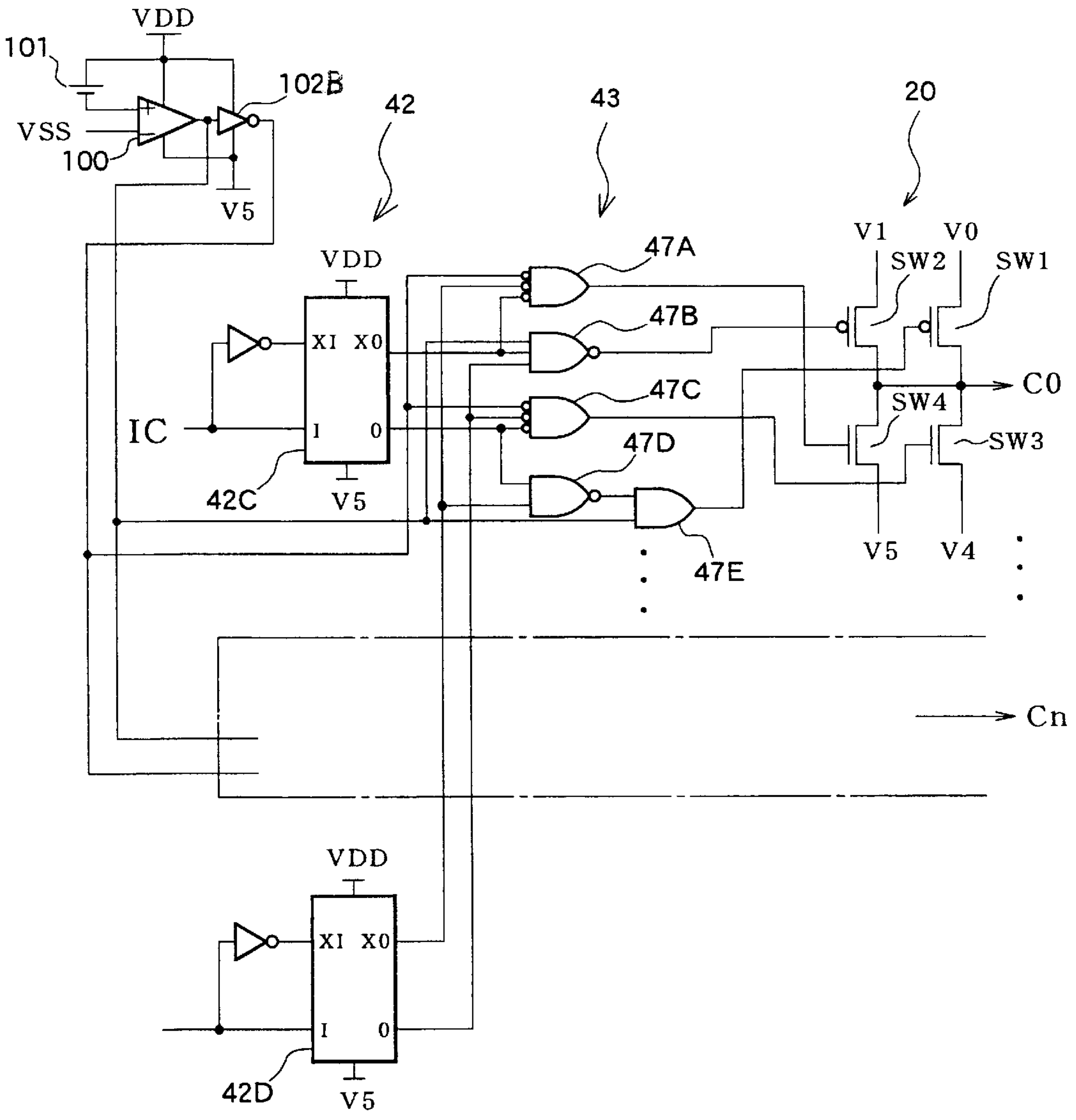
FIG. 15 is a circuit chart of the common electrode drive system according to the other embodiment of the present invention.

FIGS. 14 and 15 respectively show a segment electrode drive system and common electrode drive system for a potential selection circuit 43 with which countermeasures against instantaneous lighting is provided.

When the power supply is forcibly shut-off, the potential selection circuit 43 turns "on" only the switch SW1 which selects a potential V0 (=VDD), among the switches SW1 to SW6 in the drive circuit 20 shown in FIGS. 14 and 15, and outputs signals for turning all other switches SW2 to SW6 "off".

The segment electrode drive system-shown in FIG. 14 is provided with first to fifth logic gates 46A to 46E which control switches SW1 and SW4 to SW6 on-and-off according to the outputs from the level shifter 42A, 42B, comparator 100, and inversion element 102B.

In the sane manner, the common electrode drive system shown in FIG. 15 is provided with first to fifth logic gates 47A to 47E which control switches swl to SW4 on-and-off according to the outputs from the level shifter 42A, 42B, comparator 100, and inversion element 102B.

When the power supply potential is normal, the output of the comparator 100 is HIGH and the output of the inversion element 102B is LOW. The potential supplied to each segment electrode changes as shown in Table 1 in accordance with the logical state of the input signals IA and IB to the level shifters 42A and 42B.

On the other hand, when the power supply potential is not normal, the output of the comparator 100 is LOW and the output of the inversion element 102B is HIGFH. For this reason, the output from the fifth logic gate (AND gate) 46E, to which the output (LOW) from the comparator 100 is input, is LOW regardless of logical states of the input signals IA and IB to the level shifters 42A and 42B, whereby the switch SW1 is turned "on". Switches SW5 to SW6 are turned "off" regardless of logical states of the input signals IA and IB to the level shifters 42A and 42B. All segment electrodes can be supplied with potential V0 (=VDD) by the drive circuit 20 in this manner.

When the power supply potential is normal, the output of the comparator 100 is HIGH and the output of the inversion element 102B is LOW also on the common electrode. Therefore, the potential supplied to each segment electrode changes as shown in the above Table 2 according to logic states of input signals IC and ID to the level shifters 42C and 42D.

On the other hand, when the power supply potential is not normal, the output of the comparator 100 is LOW and the output of the inversion element 102B is HIGFH. For this reason, the output from the fifth logic gate 47E, to which the output (LOW) from the comparator 100 is input, is LOW regardless of logical states of the input signals IA and IB to the level shifters 42A and 42B, whereby the switch SWi is turned "on". Switches SW2 to SW4 are turned "off" regardless of the logical states of the input signals IC and ID to the level shifters 42C and 42D. All common electrodes can be supplied with potential V0 (=VDD) by the drive circuit 20 in this manner.

Accordingly, when the power supply potential is not normal, malfunctions such as instantaneous lighting of the liquid crystal panel 10 can be prevented by providing all of the segment electrodes and common electrodes with the potential V0 (=VDD=0V).

(Countermeasure against instantaneous lighting in the drive circuit 20)

Figure 16:
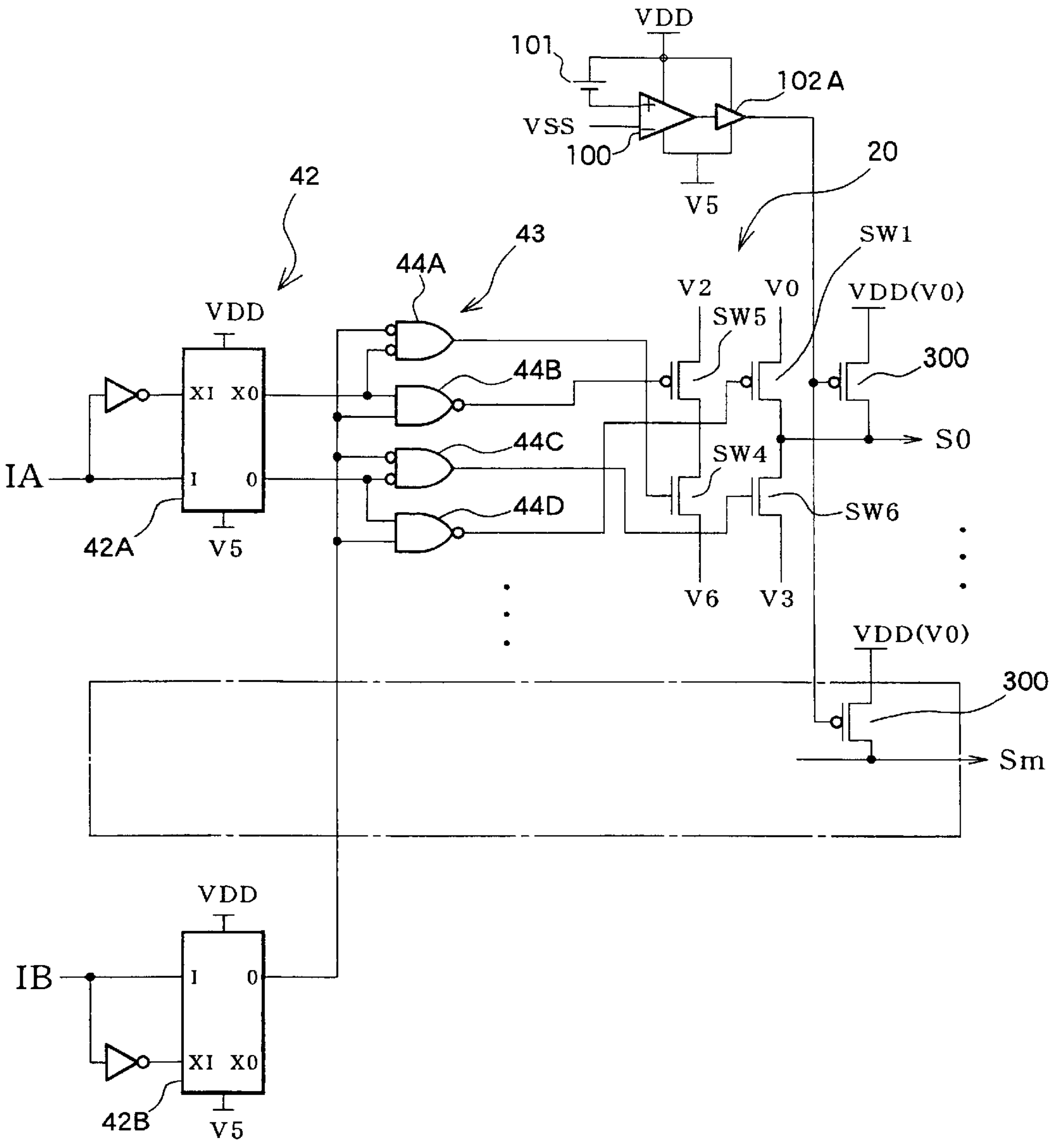
FIG. 16 is a circuit chart of the segment electrode drive system according to still another embodiment of the present invention.
Figure 17:
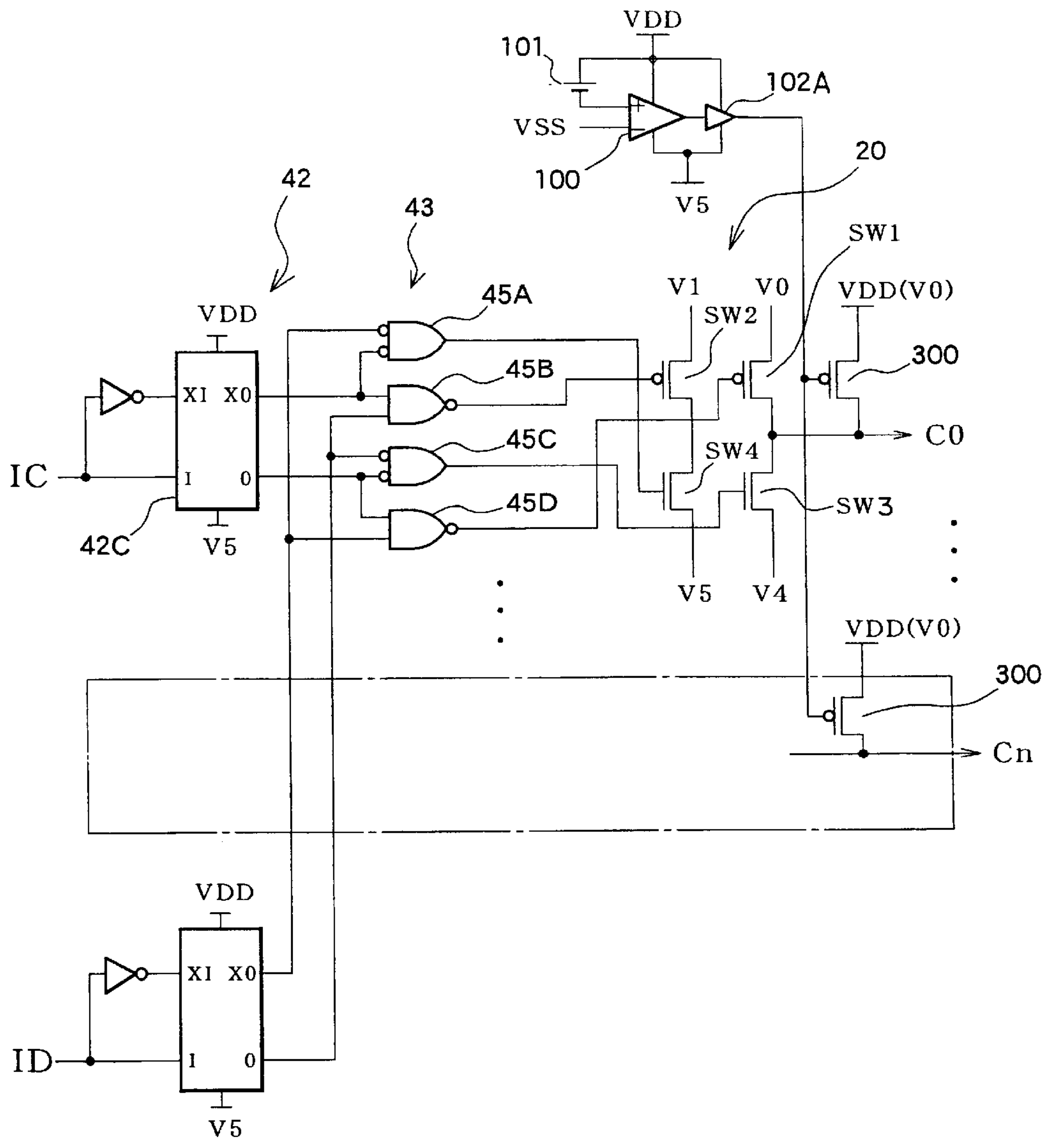
FIG. 17 is a circuit chart of the common electrode drive according to the still other embodiment of the present invention.

An improved structured of a final output stage of the drive circuit 20 of FIG. 3 is shown in FIG. 16 and FIG. 17. As shown in FIG. 16 and FIG. 17, all common electrodes C0 to Cn and all segment electrodes S0 to Sm are respectively connected to a P-type MOS transistor 300. In addition, the segment electrode drive system and common electrode drive system shown in FIG. 16 and FIG. 17 are provided with a comparator 100, a reference potential generating circuit 101, and a buffer 102A, all used in common with these drives systems.

Figure 20:
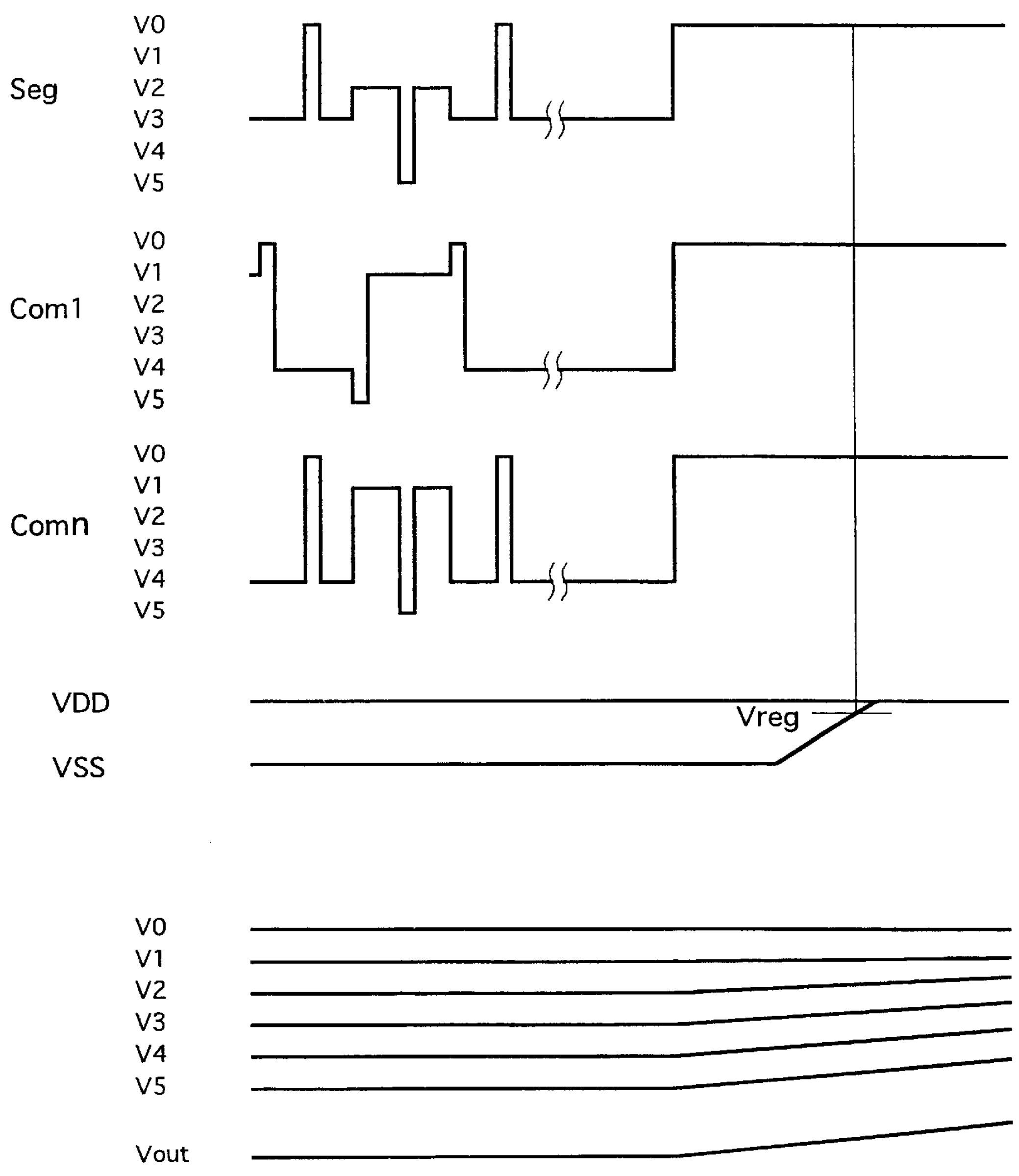
FIG. 20 is a timing chart for illustrating an operation which does not create instantaneous lighting.

When the power supply potential is abnormal, the output of the buffer 102A is LOW, causing each P-type HOS transistor 300 to be turned on. This ensures forcible supply of the first power supply potential VDD (=0V) to all common electrodes C0 to Cn and all segment electrodes S0 to Sm as shown in FIG. 20, even if the output from the level shifter 42 in FIG. 9 becomes indefinite. Malfunctions of instantaneous lighting can be prevented in this manner.

In this case, each P-type MOS transistor 300 must have a lower "on"-resistance (higher capacity) than the MOS transistors constituting switches SW1 to SW6. For example, when the "on"-resistance of switches SW1 to SW6 is 1 to 2 K Ω, "on"-resistance of the P-type MOS transistors 103 to 106 should be several tens of Ω.

<Other counter measure against instantaneous lighting in the fourth level shifter group>

(Constitution of each level shifter in the fourth level shifter group)

Figure 19:
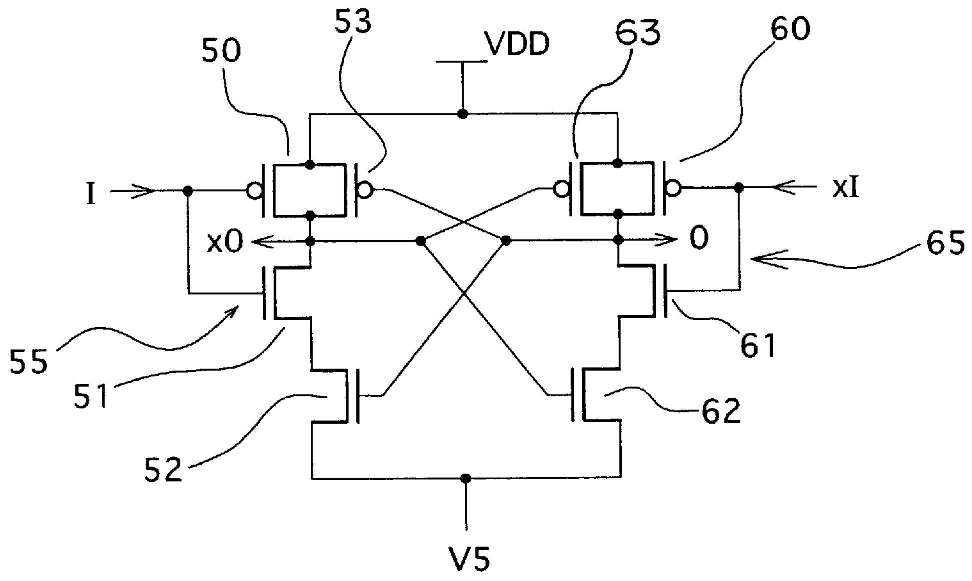
FIG. 19 is a circuit chart of a shift register relating to an embodiment of the present invention, and being an improvement of the level shifter of FIG. 9.

The level shifters 42A to 42D, etc. which constitute the fourth level shifter group shown in FIG. 3 will now be described referring to FIG. 19. As shown in FIG. 19, each of the level shifters constituting the fourth level shifter group 42 has the first and the second circuits 55 and 65 which are connected in parallel to each other. A first P-type MOS transistor 50, a first N-type MOS transistor 51, and a second N-type Nos transistor 52 are connected in series between the supply line for the first power supply potential VDD (=V0) and the supply line for the potential V5, thereby forming a first circuit 55. An output I from the second logic circuit 41 shown in FIG. 2 is supplied to the gate of the first P-type MOS transistor 50 and the gate of the first N-type MOS. transistor 51.

Parallel to these transistors 50 to 51, a second P-type MOS transistor 60, a third N-type MOS transistor 61, and a fourth N-type MOS transistor 62 are connected in series, whereby a second circuit 65 is formed. An inverted output XI from the second logic circuit 41 shown in FIG. 2 is supplied to the gate of the second P-type HOS transistor 60 and the gate of the third N-type MOS transistor 61.

Here, the potential between the first P-type MOS transistor 50 and the first N-type MOS transistor 51 is the inverted output XO of the level shifter 42, and the potential between the second P-type MOS transistor 60 and the third N-type MOS transistor 61 is the output O of the level shifter 42. The inverted output XO is supplied to the gate of the fourth N-type MOS transistor 62, and the output O is supplied to the gate of the second N-type MOS transistor 52.

In this embodiment, a third P-type MOS transistor 53 is provided parallel to the first P-type MOS transistor 50, and a fourth P-type MOS transistor 63 is provided parallel to the second P-type MOS transistor 60. The inverted output XO is supplied to the gate of the fourth P-type MOS transistor 63, and the output O is supplied to the gate of the third P-type MOS transistor 53.

(Operation of the fourth level shifter group)

The operation of the level shifter in this embodiment of the present invention shown in FIG. 19 will now be described, comparing with the operation of a conventional level shifter shown in FIG. 9 which does not have the third and fourth P-type MOS transistors 53 and 63.

In the conventional level shifter shown in FIG. 9, when an input of I=XI=OV=HIGH is established by turning the power supply off, the potential of the output O decreases to an intermediate level by the on/off operations of the second P-type MOS transistor 60 and the third N-type MOS transistor 61, finally causing the second N-type MOS transistor 52 to be turned "off" from "on". The potential of the output XO thus increases, causing the output to be indefinite. This results in instantaneous lighting.

In contrast, when the level shifter in this embodiment shown in FIG. 19 is applied to the first to third level shifters 42A to 42C, the relationship IA=IB=IC=HIGH is established by a power saving command and reset before cut-off of the power supply, and the level shifter inputs in FIG. 19 are I=HIGH and XI=LOW. In this instance, the outputs of the level shifter are O=VDD=HIGH and XO=V5=LOW.

When the relationship I=XI=HIGH is established by a power supply shut-off after this, the second P-type MOS transistor 60 changes from "on" to "off". However, the fourth P-type MOS transistor 63, which is connected in parallel with the second P-type MOS transistor 60, continues to be "on" because the gate is charged with the potential of the output XO=V5. Therefore the output O remains as output O=VDD. If the output O=VDD is maintained, the first and third P-type MOS transistors 50, 53 are turned "off" because of the relationship of the input I=H (VDD), thereby turning the first and the second N-type MOS transistors 51 and 52 "on". An inverted output XO=V5 can thus be maintained.

In this manner, even if the input from the second logic circuit 41 is I=XI=H (VDD) in the event of a power supply shut-off, the outputs (O, XO) of the level shifters 42A to 42C in the fourth level shifter group 42 in the embodiment shown in FIG. 19 can be set to the output conditions (VDD, V5) which were effective before the power supply shut-off. Thus, the output will not become indefinite as in the case of the conventional level shifters shown in FIG. 9.

Accordingly, in the level shifters 42A to 42C shown in FIG. 7 and FIG. 8, when the input is I=XI=HIGH, the output is O=VDD=HIGH, XO=V5=LOW. Thus, the state before power supply shut-off can be maintained.

In the level shifter 42D shown in FIG. 8, the input and output of the level shifter shown in FIG. 19 before shut-off the power supply are respectively I=LOW, XI=HIGH and O=V5=LOW, XO=VDD=HIGH. When the power supply is disconnected after this, even if the first P-type MOS transistor 50 in FIG. 19 is turned "off" from "on", the third P-type MOS transistor 53 which is connected parallel to this transistor 50 continues to be "on" because the gate is charged with a potential of the output O=V5. Thus, the output XO can be maintained at XO=VDD. When the output XO=VDD is maintained, both the second and fourth P-type MOS transistors 50, 53 continue to be "off" because of the relationship of the input XI=H (VDD), thereby holding the third and fourth N-type MOS transistors 61 and 62 "on". An output XO=V5 can thus be maintained.

In this manner, ever after a shutoff of the power supply the third and fourth level shifters 42C and 42D in FIG. 8 can maintain the same output conditions as those which existed before the shut-off. Therefore, each level shifter 42A to 42D in PIG. 7 and FIG. 8 can be operated in a normal manner to continue supply of potential V0 to all common and segment electrodes as shown in FIG. 20. Instantaneous lighting can thus be prevented.

(Modification of level shifter)

Figure 21:
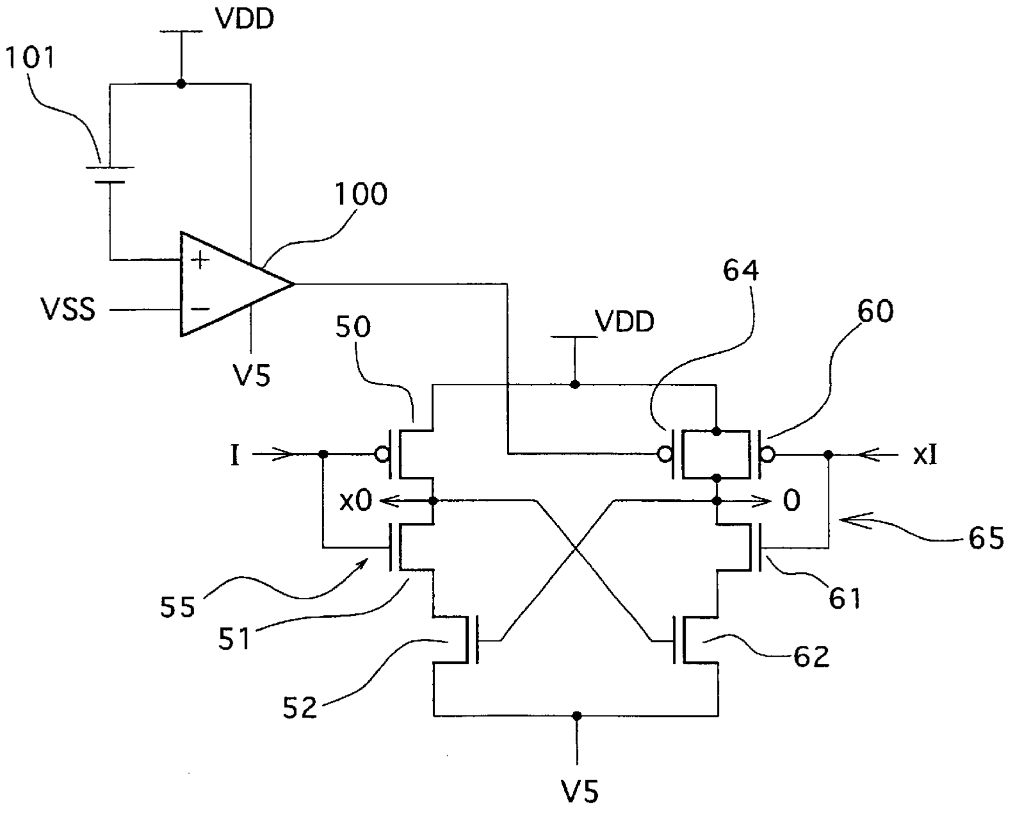
FIG. 21 is a circuit chart showing a modification of the level shifter shown in FIG. 19.
Figure 22:
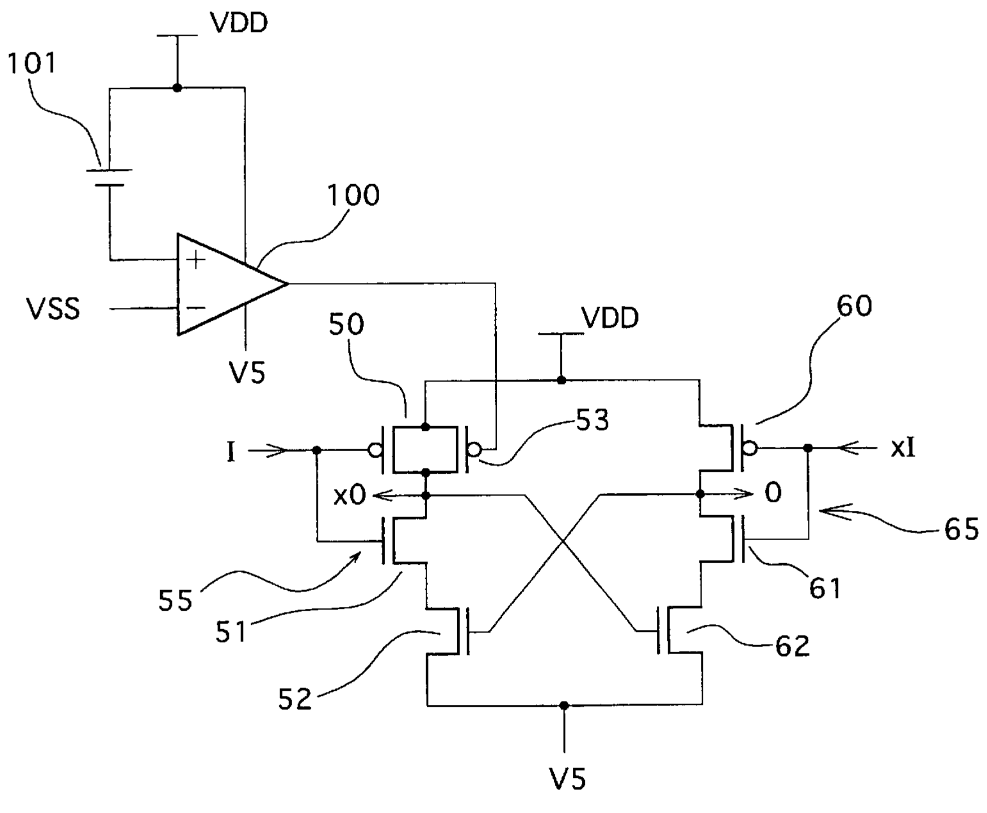
FIG. 22 is a circuit chart of another modification of the level shifter shown in FIG. 19.

FIG. 21 and FIG. 22 are modified examples of the level shifter provided with measures for preventing malfunctions due to instantaneous lighting.

In FIG. 21, a fourth P-type MOS transistor 63 is provided being connected parallel with the second P-type MOS transistor 60, but the third P-type MOS transistor 53 in not provided. In FIG. 22, on the other hand, a third P-type MOS transistor 53 is provided being connected parallel with the first P-type MOS transistor 50, but the fourth P-type MOS transistor 63 is not provided.

Figure 13:
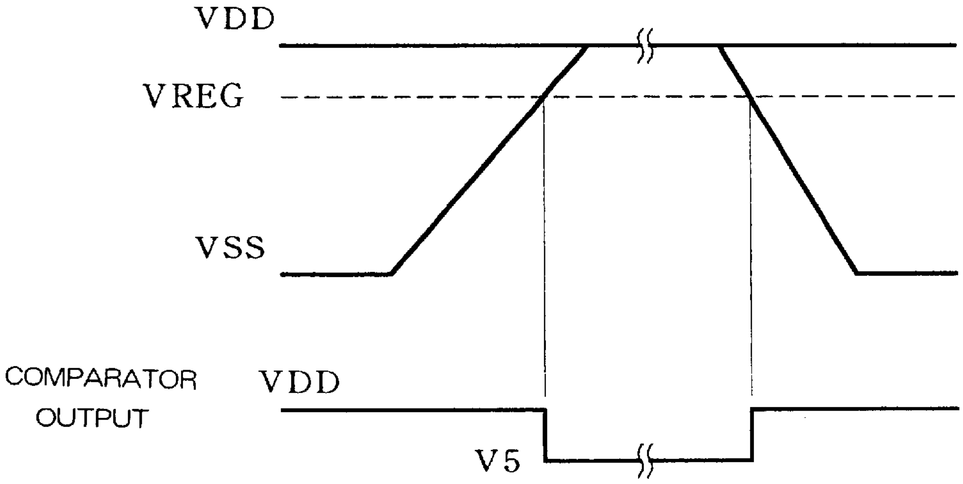
FIG. 13 is a waveform chart illustrating outputs of the comparators shown in FIGS. 11 and 12.

The gate of the fourth P-type MOS transistor 63 in FIG. 21 and the gate of the third P-type MOS transistor 53 in FIG. 22 are supplied with the output of the comparator 100 which was described in the above described embodiment. Because the output of the comparator 100 is the same as that shown in FIG. 13, the fourth P-type MOS transistor 63 in FIG. 21 and the third P-type MOS transistor 53 in FIG. 22 are turned "on" at the time of a power supply emergency.

The level shifter of the present embodiment shown in FIG. 21 can be applied to the first to third level shifters 42A to 42C in FIGS. 7 and 8. Because the relationship of IA=IB=IC=HIGH was effective among the level shifters 42A to 42C before the power supply shut-off, the level shifter inputs are I=HIGH and XI=LOW in FIG. 21. In this instance, the outputs of the level shifter are O=VDD=HIGH and XO=V5=LOW.

When the relationship I=XI=HIGH is established by a power supply shut-off after this, the second P-type MOS transistor 60 changes from "on" to "off". However, the fourth P-type MOS transistor 63 which is connected in parallel with the second P-type MOS transistor 60 is turned "on" at the time of the power supply emergency by the LOW signal from the comparator 100. The output O=VDD can be maintained in this manner. When the output XO=V5 is maintained, both the first and third P-type MOS transistors 50, 53 are turned "off" because of the relationship of the input I=H (VDD), thereby turning the first and the second N-type MOS transistors 51 and 52 "on". An inverted output XO=V5 can thus be maintained.

Therefore, even if the level shifter of FIG. 21 is applied to the first to third level shifters 42A to 42C in FIGS. 7 and 8, the same results as the results obtained using the level shifter shown in FIG. 19 can be obtained.

On the other hand, if the level shifter shown in FIG. 22 is applied to the level shifter shown in FIG.8, the input of the level shifter shown in FIG. 22 before shut off the power supply is I=LOW, XI=HIGH and the output is O=V5=LOW, XO=VDD=HIGH. When the power supply is disconnected after this, even if the first P-type MOS transistor 50 in FIG. 22 is turned "off" from "on", the third P-type MOS transistor 53 which is connected in parallel with this transistor 50 is maintained "on" due to the output of the comparator 100 at the time of the power supply emergency. Thus, the output XO can be maintained at XO=VDD. When the output XO=VDD is maintained, both the second and fourth P-type MOS transistors 50, 53 are turned "off" because of the relationship of the input XI=H (VDD), thereby holding the third and fourth N-type MOS transistors 61 and 62 to be "on". An output XO=V5 can thus be maintained.

Therefore, even if the level shifter of FIG. 22 is applied to the level shifter 42D in FIG. 8, the same results as the results obtained using the level shifter shown in FIG. 19 can be obtained.

The present invention is not limited to the embodiments described above, and many modifications and variations are possible without departing from the spirit and scope of the present invention.

For example, it is needless to mention that the second power supply potential which was a negative potential in the embodiments described above may be a positive potential.

The present invention can be applied to various types of electronic equipment such as cellular phones, game machines, electronic pocketbooks, personal computers, word processor equipment, navigation devices, and the like on which the liquid crystal panel 10 shown in FIG. 1 is mounted.

What is claimed is:

1. A semiconductor device including a drive circuit, a drive control circuit which controls the drive circuit, and a power supply circuit which supplies a potential to the drive circuit and drive control circuit, wherein the power supply circuit comprises:

a boosting circuit, to which a first power supply potential which is a ground potential from an external power supply and a second power supply potential which is a potential other than the ground potential are supplied, and raising the absolute value of the second power supply potential and charging the boosted potential to the capacitor; and a bias generating circuit generating a potential supplied to the drive circuit and the drive control circuit based on the output potential of the boosting circuit, and wherein the first power supply potential and a potential from the bias generating circuit are supplied to the drive circuit that outputs a potential selected from potentials supplied in accordance with a control of the drive control circuit during a normal power supply period, and, in the event of a power supply emergency in which an absolute value between the first and the second power supply potentials is lower than a given value, changes all potentials outputted from the drive circuit into the first power supply potential based on the signal activated in the event of the power supply emergency.

2. The semiconductor device according to claim 1, further comprising a comparator which compares a reference potential having an absolute value smaller than the absolute value between the first and the second power supply potentials, with the second power supply potential, so that a signal activated in the event of the power supply emergency is outputted.

3. The semiconductor device according to claim 1, wherein the signal activated in the event of the power supply emergency is a power-on-reset signal which is supplied from outside the semiconductor device.

4. A semiconductor device including a drive circuit, a drive control circuit which controls the drive circuit, and a power supply circuit which supplies a potential to the drive circuit and drive control circuit, wherein the power supply circuit comprises:

a boosting circuit, to which a first power supply potential which is a ground potential from an external power supply and a second power supply potential which is a potential other than the ground potential are supplied, and raising the absolute value of the second power supply potential and charging the boosted potential to the capacitor; and a bias generating circuit generating a potential supplied to the drive circuit and the drive control circuit based on the output potential of the boosting circuit, wherein the first power supply potential and a potential from the bias generating circuit are supplied to the drive circuit that outputs a potential selected from potentials supplied in accordance with a control of the drive control circuit, and wherein in the event of a power supply emergency in which an absolute value between the first and the second power supply potentials is lower than a specified value, the drive control circuit outputs a potential selecting signal that changes all potentials outputted from the drive circuit into the first power supply potential based on the signal activated when the power supply emergency occurs.

5. The semiconductor device according to claim 4, wherein the drive control circuit comprises:

a logic circuit to which the first and the second power supply potentials are supplied, and outputting various logic levels;

a level shifter group to which a potential from the power supply circuit and the first power supply potential are supplied, including a plurality of level shifters for shifting the logic levels from the logic circuit; and a potential selection circuit for outputting potential selection signals supplied to the drive circuit based on the output from the level shifter group.

6. The semiconductor device according to claim 5, wherein the level shifter group has an input level setting circuit for setting the input to the level shifters at a specified value based on the signals which become active in the event of a power supply emergency regardless of the output of the logic circuit.

7. The semiconductor device according to claim 5, wherein the potential selection circuit has an output level setting circuit for setting the output of the potential selection circuit at a specified value based on the signals which become active in the event of a power supply emergency regardless of the output of the level shifter group.

8. The semiconductor device according to clam 4, further comprising a comparator which compares a reference potential having an absolute value smaller than the absolute value between the first and the second power supply potentials, with the second power supply potential, so that a signal activated in the event of the power supply emergency is outputted.

9. The semiconductor device according to claim 4, wherein the signal activated in the event of the power supply emergency is a power-on-reset signal which is supplied from outside the semiconductor device.

10. A semiconductor device including a drive circuit, a drive control circuit which controls the drive circuit, and a power supply circuit which supplies a potential to the drive circuit and drive control circuit, wherein the power supply circuit comprises:

a boosting circuit, to which a first power supply potential which is a ground potential from an external power supply and a second power supply potential which is a potential other than the ground potential are supplied, and raising the absolute value of the second power supply potential and charging the boosted potential to the capacitor; and a bias generating circuit generating a potential supplied to the drive circuit and the drive control circuit based on the output potential of the boosting circuit, and wherein the first power supply potential and a potential from the bias generating circuit are supplied to the drive circuit that outputs a potential selected from potentials supplied in accordance with a control of the drive control circuit during a normal power supply period, and wherein the drive control circuit comprises:

a logic circuit to which the first and the second power supply potentials are supplied, and outputting a first logic level and a second logic level;

a level shifter group to which a potential from the power supply circuit and the first power supply potential are supplied, and shifting an output level from the logic circuit; and a potential selection circuit for outputting potential selection signals supplied to the drive circuit based on the output from the level shifter group, wherein:

each of level shifters forming the level shifter group comprises first and second circuits which are connected in parallel between a supply line for the first power supply potential and a supply line for a potential supplied by the power supply circuit;

the first circuit includes a first MOS transistor of primary conductive-type, a first MOS transistor of secondary conductive-type, and a second MOS transistor of secondary conductive-type which are connected in series to the first circuit, the first logic level from the logic circuit is supplied to gates of the first MOS transistor of primary conductive-type and the first MOS transistor of secondary conductive-type, and a potential between the first MOS transistor of primary conductive-type and the first MOS transistor of secondary conductive-type is a first output potential of each of the level shifters;

the second circuit includes a second MOS transistor of primary conductive-type, a third MOS transistor of secondary conductive-type, and a fourth MOS transistor of secondary conductive-type which are connected in series to the second circuit, the second logic level from the logic circuit is supplied to gates of the second MOS transistor of primary conductive-type and the third MOS transistor of secondary conductive-type, and a potential between the second MOS transistor of primary conductive-type and the third MOS transistor of secondary conductive-type is a second output potential of each of the level shifters;

the second output potential is supplied to a gate of the second MOS transistor of secondary conductive-type in the first circuit, and the first output potential is supplied to a gate of the fourth MOS transistor of secondary conductive-type; and each of the level shifters further includes a potential maintaining circuit for maintaining the first and the second output potentials of each of the level shifters at a state before occurrence of a power supply emergency, in the event of a power supply emergency in which an absolute value between the first and the second power supply potentials is lower than a prescribed value.

11. The semiconductor device according to claim 10, wherein the potential maintaining circuit provided in each of the level shifters forming the level shifter group comprises:

a third MOS transistor of primary conductive-type connected in parallel with the first MOS transistor of primary conductive-type; and a fourth MOS transistor of primary conductive-type connected in parallel with the second MOS transistor of primary conductive-type, and wherein the second output potential is supplied to a gate of the third MOS transistor of primary conductive-type, and the first output potential is supplied to a gate of the fourth MOS transistor of primary conductive-type.

12. The semiconductor device according to claim 10, wherein the potential maintaining circuit provided in at least one of the level shifters forming the level shifter group includes a third MOS transistor of primary conductive-type connected in parallel to the first MOS transistor of primary conductive-type, and, when an on/off state of the first MOS transistor of primary conductive-type changes before and after the power supply emergency, the on/off state of the third MOS transistor of primary conductive-type is set identical to an on/off state of the first MOS transistor of primary conductive-type which existed before the power supply emergency.

13. The semiconductor device according to claim 10, wherein the potential maintaining circuit provided in at least one of the level shifters forming the level shifter group includes a fourth MOS transistor of primary conductive-type connected in parallel to the second MOS transistor of primary conductive-type, and when an on/off state of the second MOS transistor of primary conductive-type changes before and after the power supply emergency, the on/off state of the fourth MOS transistor of primary conductive-type after the power supply emergency is set identical to an on/off state of the second MOS transistor of primary conductive-type before the power supply emergency.

14. A liquid crystal device comprising the semiconductor device as defined in claim 1, and a liquid crystal panel being driven based on the voltage supplied by the semiconductor device.

15. Electronic equipment comprising the liquid crystal device as defined in claim 14.

* * * * *